(12) United States Patent
Terashima et al.

(10) Patent No.: US 6,225,637 B1
(45) Date of Patent: May 1, 2001

(54) ELECTRON BEAM EXPOSURE APPARATUS

(75) Inventors: Shigeru Terashima, Utsunomiya; Masato Muraki, Inagi; Masahiko Okunuki, Akiruno; Akira Miyake, Utsunomiya; Shin Matsui, Urawa, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/954,520

(22) Filed: Oct. 20, 1997

(30) Foreign Application Priority Data

Oct. 25, 1996 (JP) ................................. 8-283814
Dec. 6, 1996 (JP) ................................. 8-326770
Jan. 31, 1997 (JP) ................................. 9-018773

(51) Int. Cl.$^7$ ................................. H01J 37/302
(52) U.S. Cl. ................................. 250/492.2; 250/492.22
(58) Field of Search ................................. 250/492.2, 492.22, 250/492.23, 492.24, 396 R, 398

(56) References Cited

U.S. PATENT DOCUMENTS

| | | | |
|---|---|---|---|
| 4,393,312 | 7/1983 | Collier et al. | 250/492.2 |
| 4,914,304 | 4/1990 | Koyama | 250/492.2 |
| 4,967,088 | 10/1990 | Stengl et al. | 250/491.1 |
| 5,079,112 | 1/1992 | Berger | 430/4 |
| 5,227,269 | 7/1993 | Scott | 430/5 |
| 5,250,812 | * 10/1993 | Murai et al. | 250/492.2 |
| 5,276,331 | 1/1994 | Oae et al. | 250/396 |
| 5,528,048 | 6/1996 | Oae et al. | 250/492.22 |
| 5,624,774 | 4/1997 | Okino | 430/5 |
| 5,731,591 | * 3/1998 | Yamada et al. | 250/492.2 |
| 5,751,004 | * 5/1998 | Robinson et al. | 250/492.2 |
| 5,767,521 | 6/1998 | Takeno et al. | 250/492.2 |
| 5,872,366 | * 2/1999 | Ooaeh et al. | 250/492.2 |

FOREIGN PATENT DOCUMENTS

| | | |
|---|---|---|
| 0 257 694 | 3/1988 | (EP) . |
| 0 294 363 | 12/1988 | (EP) . |
| 0 344 646 | 12/1989 | (EP) . |
| 0 366 367 | 5/1990 | (EP) . |
| 0 688 036 | 12/1995 | (EP) . |
| 2 197 751 | 5/1988 | (GB) . |
| 3-99419 | 4/1991 | (JP) . |
| 8-139013 | 5/1996 | (JP) . |

OTHER PUBLICATIONS

Patent Abstracts of Japan, vol. 015, No. 439 (P–1273), Nov. 8, 1991 (corresponds to JP 03–185400).

* cited by examiner

*Primary Examiner*—Kiet T. Nguyen
(74) *Attorney, Agent, or Firm*—Fitzpatrick, Cella, Harper & Scinto

(57) ABSTRACT

An electron beam exposure apparatus for projecting an image formed by electron beams onto a wafer via a reduction electron optical system, irradiates collimated electron beams toward an aperture board having an arcuated aperture sandwiched between two arcs having, as the center, the axis of the reduction electron optical system, and exposes the wafer with electron beams having an arcuated sectional shape that have been transmitted through the aperture.

70 Claims, 26 Drawing Sheets

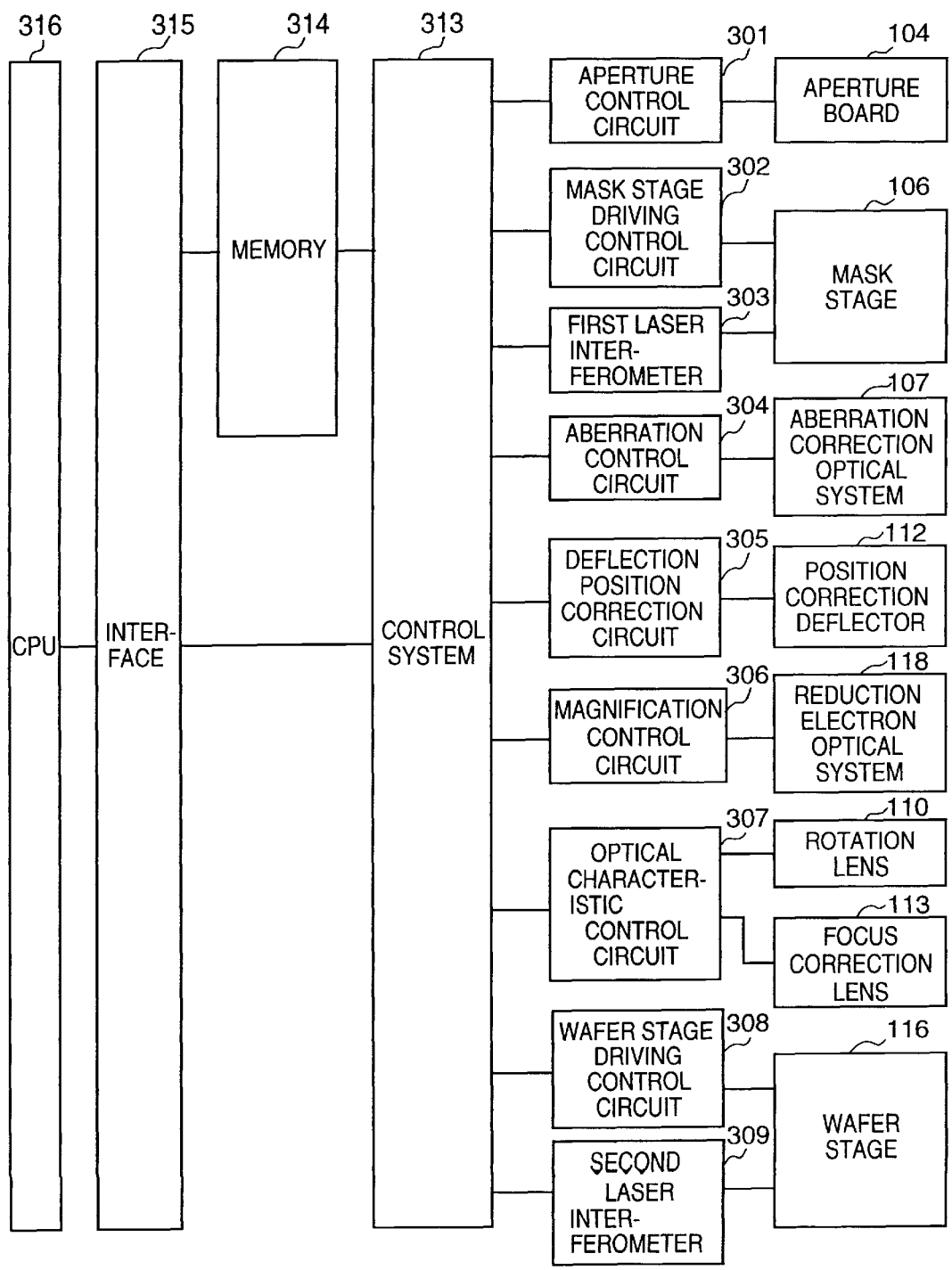

STEPPING METHOD

F I G. 11
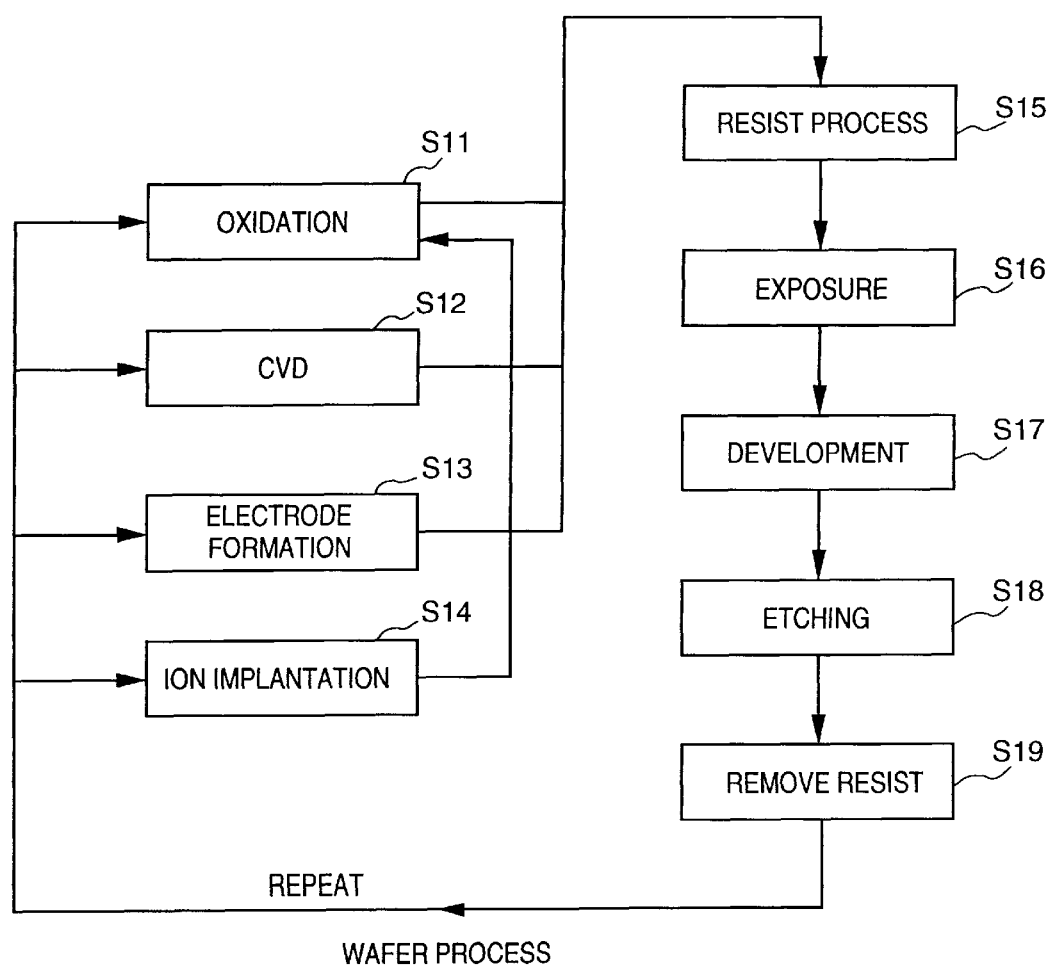

FIG. 13
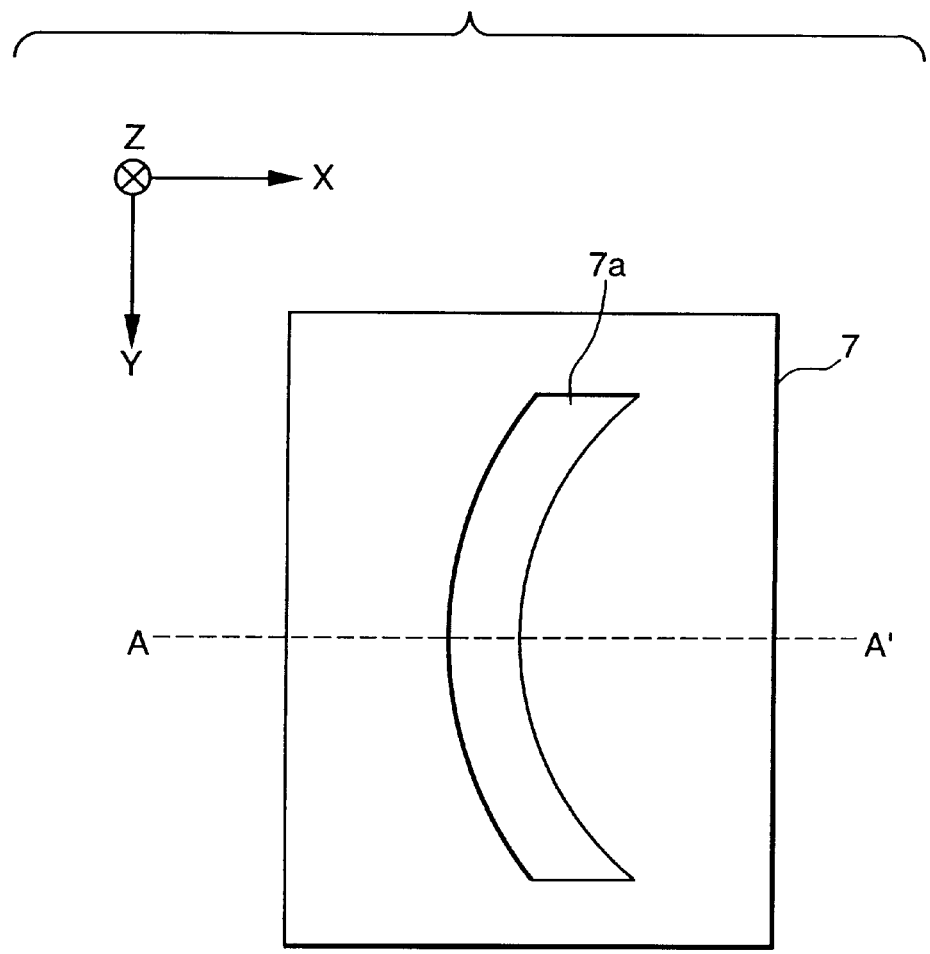
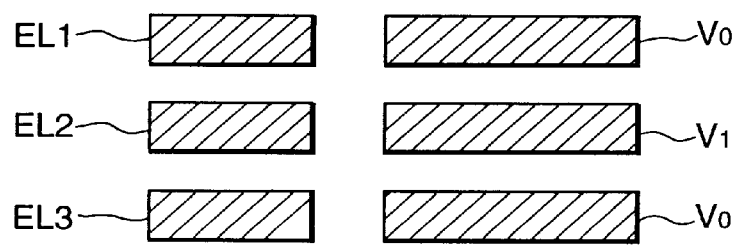
A-A' SECTION

ARCUATED EXPOSURE REGION (ON WAFER)

SCANNING DIRECTION →

FIG. 22
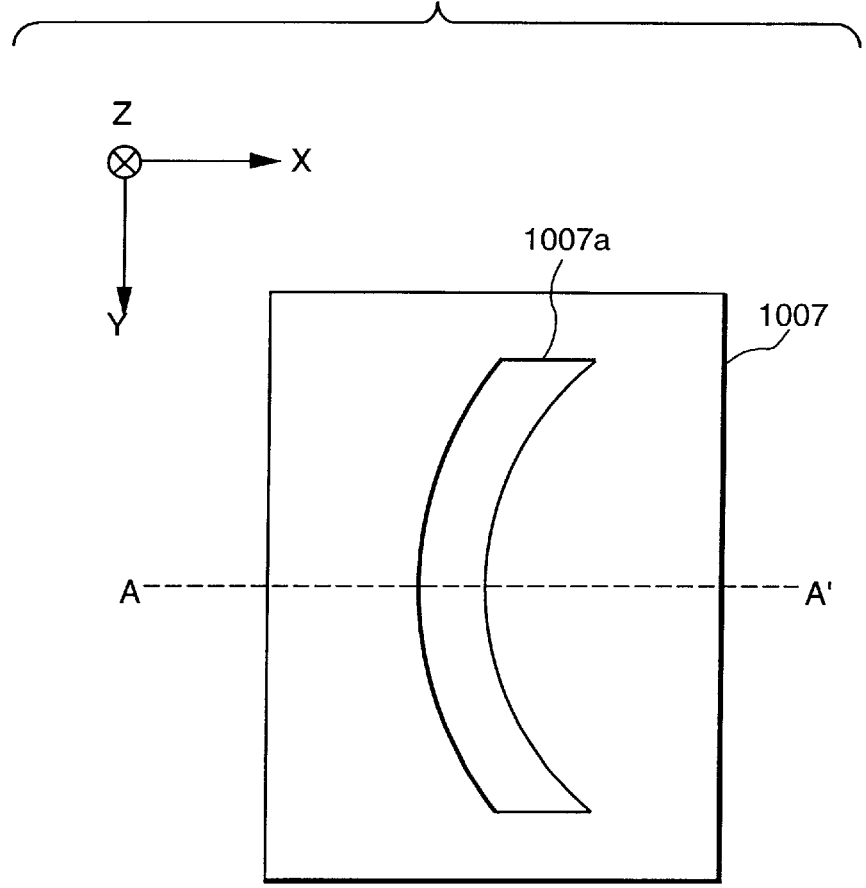
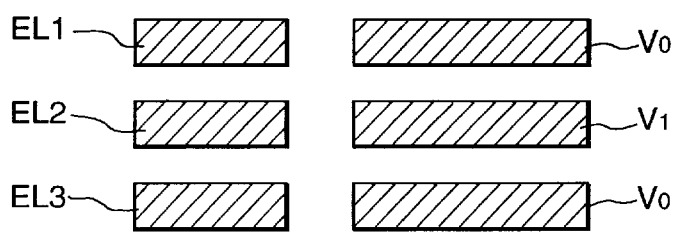
A-A' SECTION

ELECTRON BEAM EXPOSURE APPARATUS

BACKGROUND OF THE INVENTION

The present invention relates to an electron beam exposure apparatus for projecting an image formed by electron beams onto the object to be exposed such as a wafer via a reduction electron optical system.

In the mass production process for manufacturing semiconductor memory devices, an optical stepper with high productivity is used. However, in the manufacture of memory devices since 1G and 4G DRAMs having a line width of 0.2 µm or less, an electron beam exposure method that can assure high resolution and high productivity is expected to replace optical exposure.

As a conventional electron beam exposure method, a single-beam Gaussian scheme and variable forming scheme are popular, and since these schemes have low productivity, they are used in only applications that use excellent resolving performance of electron beams, such as mask drawing, studies and developments of VLSIs, exposure of ASIC devices that are manufactured in small quantities, and the like.

As described above, how to improve the productivity is a serious problem upon application of the electron beam exposure method to the mass production process.

In recent years, as a method of solving the above-mentioned problem, a stepping scheme has been proposed. This scheme (FIG. 9) aims at improving the productivity of drawing by forming repetitive portions of a memory circuit pattern as cells in units of regions having a width of several µm.

However, the maximum exposure region that can be simultaneously exposed by this scheme is as small as about several µm, which is the same as that in the variable forming scheme, and in order to obtain a broader exposure region, a plurality of (two or three) deflectors must be arranged, and chromatic aberration, distortion, and the like caused by deflection must be removed using an MOL (movable objective lens system).

In order to improve the productivity, it is required to broaden the drawing region. However, the deflection amount that can assure a resolution of 0.2 µm or less and a stitching precision of 20 to 30 nm is about several mm.

As described above, in the conventional electron beam exposure apparatus, the region that can be exposed simultaneously, i.e., a so-called exposure region is extremely smaller than that in an optical exposure apparatus or the like. For this reason, a full plate method of exposing the entire wafer by scanning an electron beam and mechanically scanning the wafer and mask is used. In order to expose the entire surface of the wafer, the stage must be reciprocally scanned a large number of times, and consequently, the stage scanning time becomes a main factor that determines productivity. Hence, a very long time is required for exposing a single wafer as compared to the optical exposure apparatus.

The throughput can only be greatly improved by either increasing the scanning speed or broadening the irradiation region. On the other hand, on a conventional irradiation region as small as several µm, the image is blurred under the influence of the space charge of beam currents, if the current density increases. That is, since the maximum irradiation current value is limited, the problem still remains unsolved even when the high scanning speed is attained.

As described above, it is hard to broaden the exposure region as long as image formation is done using a narrow region in which the on-axis aberration of an electron optical system is small like the conventional exposure method.

SUMMARY OF THE INVENTION

The present invention has been made in consideration of the above situation, and has as its one object to improve the throughput by broadening the exposure region.

According to the present invention, the foregoing object is attained by providing an electron am exposure apparatus for projecting an image formed by electron beams onto an object to be exposed via a reduction electron optical system, comprising: carrying means for carrying the object to be exposed; and irradiation means for irradiating electron beams having an arcuated sectional shape sandwiched between two arcs having, as a center, an axis of the reduction electron optical system, toward the object to be exposed.

In a preferred embodiment, correction means for correcting aberrations produced when the electron beams pass through the reduction electron optical system.

In a preferred embodiment, the correction means diverges or converges the electron beams to give different divergent or convergent effects in a tangential direction and a radius vector direction of the arc in the arcuated section defined by the electron beams.

In a preferred embodiment, the correction means has an arcuated aperture for transmitting the electron beams coming from the irradiation means.

In a preferred embodiment, the irradiation means has: photoelectric conversion means for converting light into electrons; projection means for projecting an image of light having an arcuated sectional shape sandwiched between two arcs having, as the center, the axis of the reduction electron optical system, onto a photoelectric conversion surface of the photoelectric conversion means; and acceleration means for accelerating the electrons output from the photoelectric conversion surface in a direction of the object to be exposed.

In a preferred embodiment, the irradiation means has: an electron beam source for emitting electron beams; first deflection means, having two cylindrical surface electrodes having a first axis as a center, for deflecting the electron beams emitted by the electron beams source by an electric field across the two cylindrical surface electrodes; and an aperture board having an arcuated aperture sandwiched between two arcs having, as the center, the axis of the reduction electron optical system, and the irradiation means irradiates electron beams having an arcuated sectional shape, which have been transmitted through the aperture of the aperture board, of the deflected electron beams toward the object to be exposed.

According to another aspect of the present invention, the foregoing object is attained by providing an electron beam exposure method for projecting an image formed by electron beams onto an object to be exposed via a reduction electron optical system, comprising the step of: exposing an entire exposure region on the object to be exposed by scanning electron beams having an arcuated sectional shape sandwiched between two arcs having, as a center, an axis of the reduction electron optical system, on the object to be exposed.

In a preferred embodiment, the step of correcting aberrations produced when the electron beams pass through the reduction electron optical system.

In a preferred embodiment, the step of correcting the aberrations includes the step of diverging or converging the electron beams to give different divergent or convergent effects in a tangential direction and a radius vector direction of the arc in the arcuated section defined by the electron beams.

In still another aspect of the present invention, the foregoing object is attained by providing an electron beam exposure method for projecting an image formed by electron beams onto an object to be exposed via a reduction electron optical system, comprising the steps of: projecting an image of light having an arcuated sectional shape sandwiched between two arcs having, as the center, the axis of the reduction electron optical system, onto a photoelectric conversion surface of a photoelectric conversion member; accelerating and irradiating electron beams having an arcuated sectional shape output from the photoelectric conversion surface in a direction of the object to be exposed; and scanning the electron beams having the arcuated sectional shape on the object to be exposed, thereby exposing an entire exposure region on the object to be exposed.

In a preferred embodiment, the step of correcting aberrations produced when the electron beams pass through the reduction electron optical system.

In a preferred embodiment, the step of correcting the aberrations includes the step of diverging or converging the electron beams to give different divergent or convergent effects in a tangential direction and a radius vector direction of the arc in the arcuated section defined by the electron beams.

In still another aspect of the present invention, the foregoing object is attained by providing an electron beam exposure method for projecting an image formed by electron beams onto an object to be exposed via a reduction electron optical system, comprising the steps of: deflecting electron beams emitted by an electron beam source by an electric field across two cylindrical surface electrodes having a first axis as a center; irradiating the deflected electron beams onto an aperture board having an arcuated aperture sandwiched between two arcs having, as a center, an axis of the reduction electron optical system; irradiating electron beams having an arcuated sectional shape, which have been transmitted through the aperture toward the object to be exposed; and scanning the electron beams having the arcuated sectional shape on the object to be exposed, thereby exposing an entire exposure region on the object to be exposed.

In still another aspect of the present invention, the foregoing object is attained by providing an electron beam exposure method for projecting an image formed by electron beams onto an object to be exposed via a reduction electron optical system, comprising the steps of: deflecting electron beams emitted by an electron beam source by an electric field across two cylindrical surface electrodes having a first axis as a center; further deflecting the deflected electron beams by an electric field, in a direction opposite to a direction of the electric field, across two cylindrical surface electrodes having a second axis as a center; irradiating the deflected electron beams onto an aperture board having an arcuated aperture sandwiched between two arcs having, as a center, an axis of the reduction electron optical system; irradiating electron beams having an arcuated sectional shape, which have been transmitted through the aperture toward the object to be exposed; and scanning the electron beams having the arcuated sectional shape on the object to be exposed, thereby exposing an entire exposure region on the object to be exposed.

Further objects, features and advantages of the present invention will become apparent from the following detailed description of embodiments of the present invention with reference to the accompanying drawings.

BRIEF DESCRIPTION OF THE DRAWINGS

FIG. 3 is a block diagram showing the arrangement of principal part of the electron beam exposure apparatus of the first embodiment;

FIG. 11 is a detailed flow chart of a wafer process;

FIG. 13 is an explanatory view of an aberration correction optical system;

FIG. 22 is an explanatory view of an aberration correction optical system;

DETAILED DESCRIPTION OF THE PREFERRED EMBODIMENTS

Basic Principle of the Present Invention

In a conventional electron beam exposure apparatus, the one-shot exposure region of an electron optical system is extremely smaller than that of the projection optical system of an optical exposure apparatus. For this reason, since the electronic scanning distance and mechanical scanning distance required for exposing the entire wafer are considerably longer than those in the optical exposure apparatus, a very long time is required, resulting in a very low throughput. In order to improve the throughput, either the electronic and mechanical scanning speeds must be increased, or the one-shot exposure region must be broadened.

The present invention has as its one object to improve the throughput by broadening the exposure region.

Figure 8A:
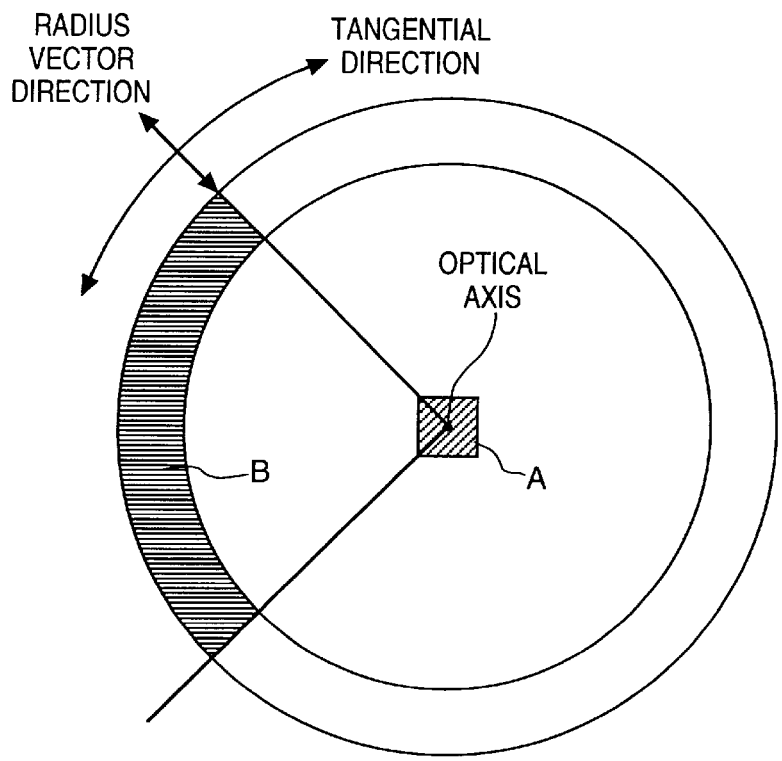
FIGS. 8A and 8B are views for explaining the basic technical principle of the present invention.
Figure 8B:
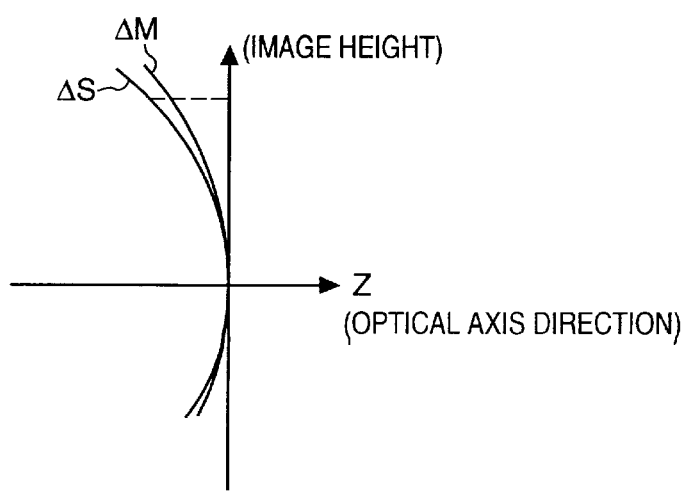
Figure 9:
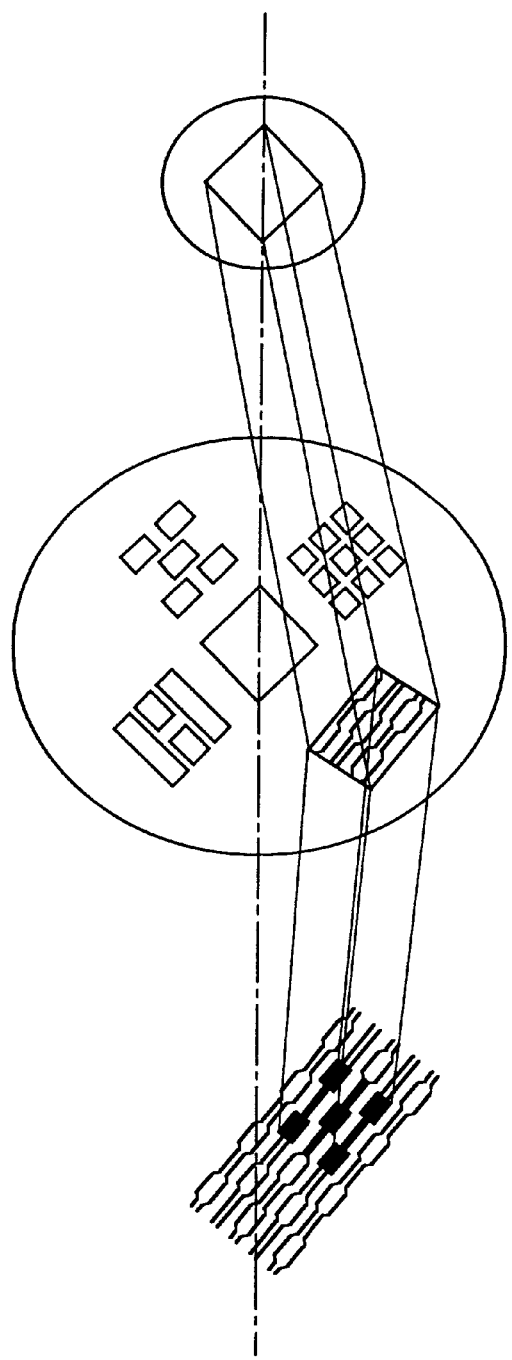
FIG. 9 is a perspective view for explaining a conventional stepping electron beam exposure apparatus.

When electron beams having in a broad section are to be imaged on a wafer, aberrations (especially, curvature of field and astigmatism) worsen as the position under consideration is separated from the optical axis of the electron optical system (separated from the optical axis in the radius vector direction). In view of this problem, as shown in FIG. 8A, the present invention does not use any electron beams in the on-axis region (A in FIG. 8A) of the electron optical system, which region is used in the conventional electron beam exposure apparatus, but uses electron beams in an arcuated region (B in FIG. 8A) sandwiched between two arcs having the optical axis as the center. With these electron beams, the curvature of field in the exposure region can be substantially completely removed. In this state, astigmatism (FIG. 8B) cannot be removed. However, since the focal point positions, in the radius vector direction and in the tangential direction, of electron beams in the exposure region are substantially identical positions, astigmatism can be substantially completely removed by arranging a correction means that gives different divergent or convergent effects to the electron beams in the exposure region in the radius vector direction and the tangential direction. As a result, the exposure region of the electron beam exposure apparatus of the present invention can be greatly broadened as compared to the conventional apparatus.

First Embodiment

EXAMPLE 1

Figure 1:
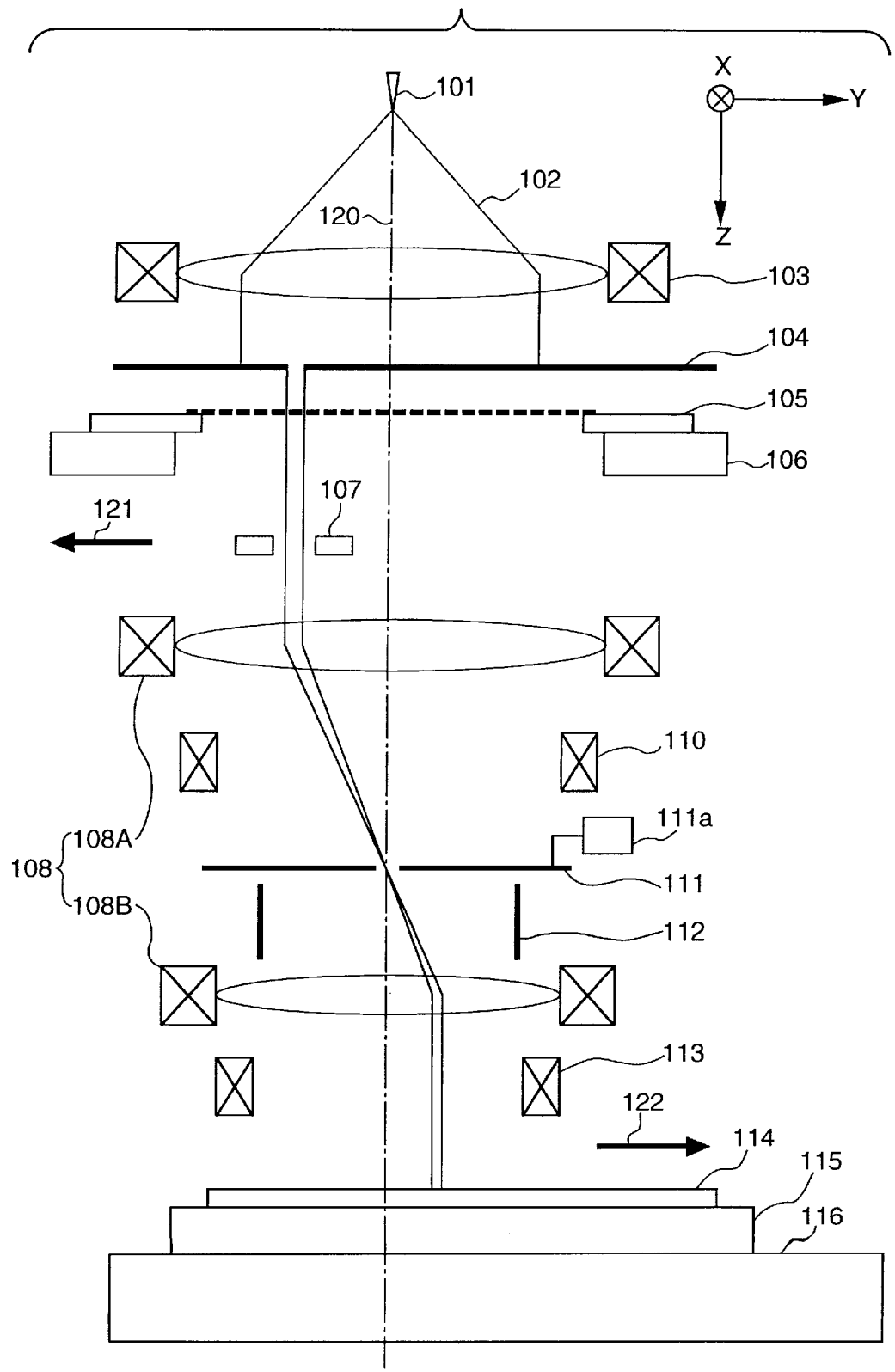
FIG. 1 is a diagram showing the arrangement of an electron beam exposure apparatus according to the first embodiment of the present invention.

FIG. 1 shows the arrangement of an electron beam exposure apparatus of the present invention. Electron beams 102 emitted by an electron gun 101 are converted into nearly collimated electron beams by a condenser lens 103, and these beams enter an aperture board 104. The detailed arrangement of the aperture board 104 will be explained later. The aperture board 104 has an arcuated aperture, which extracts the electron beams in an arcuated region (which is sandwiched between two arcs having, as the center, the optical axis of a reduction electron optical system 108 to be described later), and guides them to a mask 105 having a pattern defined by electron beam transmitting and shielding portions. The mask 105 may use either a scattering type mask which has a scattering member pattern that scatters electron beams on a membrane that transmits electron beams, or a stencil type mask having an absorption member pattern for shielding or attenuating electron beams. This embodiment uses the scattering type mask. The electron beam mask 105 is placed on a mask stage which is movable in at least the X- and Y-directions. The electron beam mask 105 will be described in detail later.

The electron beams coming from the arcuated region on the mask 105 are imaged on a wafer 114 via a reduction electron optical system 108 made up of electron lenses 108A and 108B. In this case, the electron beams are imaged on the wafer via an aberration correction optical system 107 that corrects aberrations (especially, astigmatism) produced when the electron beams are transmitted through the reduction electron optical system. The aberration correction optical system 107 is an electrode which has an arcuated aperture 107a which is sandwiched between two arcs having the optical axis of the reduction electron optical system 108 as the center as in the aperture board 104, and is broader than the aperture board 104 so as not to shield the electron beams coming from the electron beam mask 105. The potential of the system 107 is set to accelerate or decelerate the electron beams from the electron beam mask 105. As a consequence, the aberration correction optical system 107 builds an electron lens that gives different divergent or convergent effects in the tangential and radius vector directions of the arcuated aperture, in other words, an electron lens having different focal lengths in the tangential and radius vector directions of the arcuated aperture. This embodiment adopts an electron lens made up of a single electrode, but may adopt a unipotential lens made up of three electrodes having the same aperture shape.

Reference numeral 110 denotes a rotation lens for rotating a pattern image on the mask 105, which image is to be projected onto the wafer 114; 111, a scattered electron beam limit aperture which shields electron beams transmitted through and scattered by the scattering member of the mask 105, and transmits electron beams transmitted through a portion without any scattering member; 112, a position correction deflector for correcting the position of the pattern image on the electron beam mask 105, which image is to be projected onto the wafer 114; and 113, a focus correction lens of the reduction electron optical system 108.

Reference numeral 115 denotes a wafer chuck that carries the wafer 114; and 116, a wafer stage which carries the wafer chuck, and is movable in the X- and Y-directions and rotatable in the X-Y plane.

In the above-mentioned arrangement, when the mask 105 and wafer 114 are synchronously moved at speeds corresponding to the reduction ratio of the reduction electron optical system 108 respectively in the directions of arrows 121 and 122, the pattern of the arcuated region on the mask 105 is sequentially exposed onto the wafer 114.

Figure 2A:
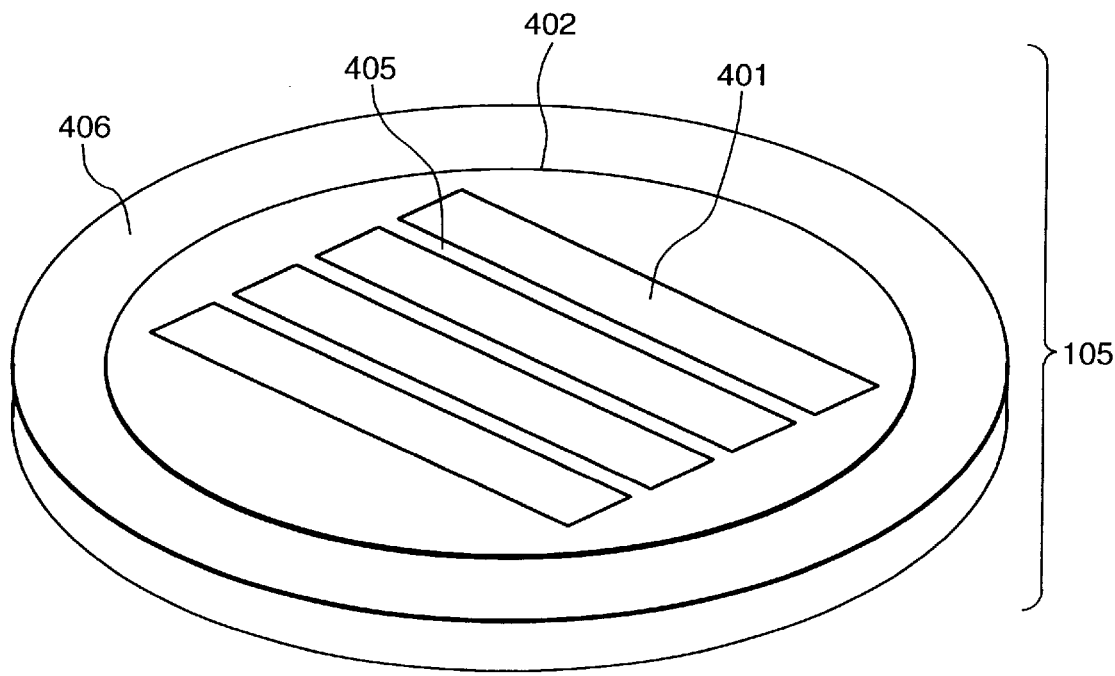
FIGS. 2A and 2B are respectively a perspective view and a side view of a mask of the first embodiment.
Figure 2B:
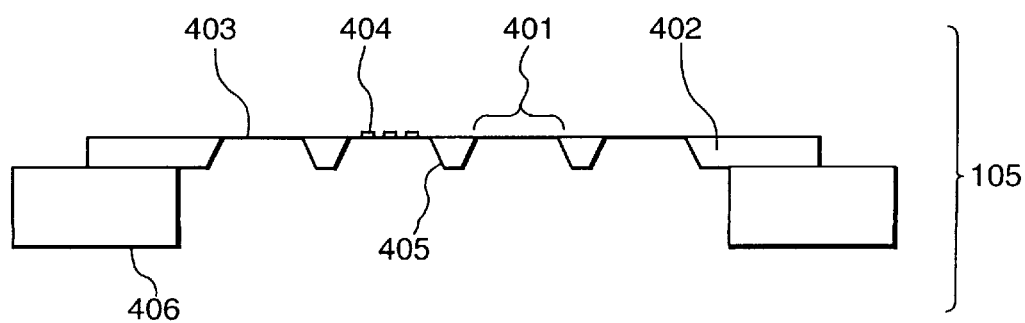

FIGS. 2A and 2B show the electron beam mask 105 used in the electron beam exposure apparatus of this embodiment. Reference numeral 401 denotes a mask pattern region; 402, a mask wafer; 403, an electron beam transmission membrane; 404, an electron beam scattering member; 405, reinforcement beams; and 406, a mask frame. In the arrangement of this mask, a 0.07-$\mu$m thick gold film is patterned as the scattering member 404 on a 0.1-$\mu$m thick SiN membrane 403, which is formed on a 2-mm thick silicon wafer 402. Since the silicon wafer alone is hard to handle, it is fixed to the mask frame 406 used in, e.g., X-ray exposure. The 0.1-$\mu$m thick SiN film as the membrane of this mask has a very small mechanical strength. For example, the circuit pattern for one 4G-DRAM chip requires an area of about 20 mm×35 mm. Assuming that such pattern is transferred in a reduction ratio of ¼ to ⅕ as in the conventional optical exposure apparatus, that area becomes 80 mm to 100 mm×140 mm to 175 mm on the mask. It is hard to form such pattern on the mask using a single window in terms of the mechanical strength of the membrane film. Also, it is hard to uniformly form a very thin membrane over the area way beyond a diameter of 100 mm. For this reason, in this embodiment, the reduction ratio of the reduction electron optical system 108 is set at ½, and the pattern to be exposed is divided into a plurality of small regions on the mask. When the reduction ratio is ½, for example, one 4G-DRAM chip requires only an area of about 40 mm×70 mm on the mask.

As shown in FIG. 2A, in this embodiment, the mask is formed by dividing a pattern for one chip into four windows (small regions). As described above, it is very difficult to make up a pattern for one chip using a single window in terms of the mechanical strength and positional distortion so as to form a circuit pattern on the very thin membrane film. Also, an exposure region that allows irradiation and image formation by one shot of electron beams is limited. For these reasons, patterns in a plurality of windows having a width of about 10 mm are individually exposed to transfer a pattern for one chip. The interval between the adjacent divided windows is set at several mm to leave the silicon wafer, and the left portions are used as the reinforcement beams to assure a high mechanical strength. The arrangement of this embodiment is practical since the mask can be prepared by a 4"wafer.

FIG. 3 is a block diagram showing the arrangement of principal part of the electron beam exposure apparatus of this embodiment. The same reference numerals in FIG. 3 denote the same parts as in FIG. 1, and a detailed description thereof will be omitted.

Reference numeral 301 denotes an aperture control circuit for controlling the aperture shape of the aperture board 104; 302, a mask stage driving control circuit for controlling the movement of the mask stage 106; 303, a first laser interferometer for measuring the position of the mask stage 106 in real time; 309, a second laser interferometer for measuring the position of the wafer stage 116 in real time; 305, a deflection position correction circuit for controlling the position of the pattern image to be projected onto the wafer 114 using the second interferometer and the position correction deflector 112; 304, an aberration control circuit for controlling the aberration characteristics of the aberration correction optical system 107; 306, a magnification control circuit for controlling the magnification (reduction ratio) of the reduction electron optical system 108; 307, an optical characteristic control circuit for controlling the rotation lens 110 and the focus correction lens 113 that adjust the optical characteristics (the focal point position and rotation of an image) of the reduction electron optical system 108; 308, a wafer stage driving control circuit for controlling the movement of the wafer stage 116; 313, a control system for controlling the above-mentioned arrangement; 314, a memory that stores control data to be referred to by the control system 313; 315, an interface; and 316, a CPU for controlling the entire electron beam exposure apparatus.

Figure 4:
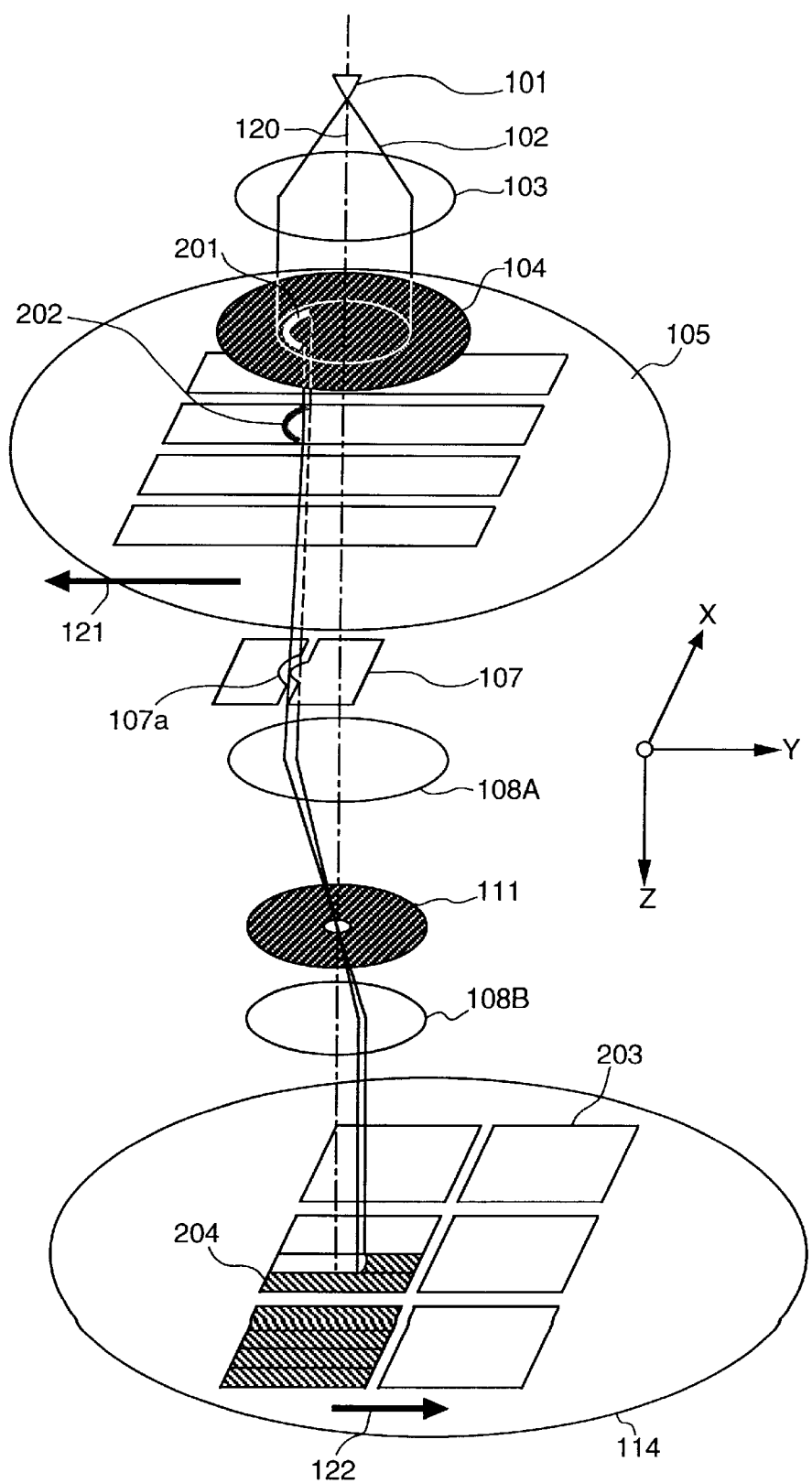
FIG. 4 is a perspective view for explaining exposure.

FIG. 4 is a view for explaining exposure of this embodiment. The same reference numerals in FIG. 4 denote the same parts as in FIG. 1, and a detailed description thereof will be omitted. Reference numeral 201 denotes an aperture of the aperture board 104; 202, an electron beam irradiation region on the mask; 203, a device pattern on the wafer; and 204, electron beam irradiation regions by wafer scanning.

Exposure in this embodiment will be described below with reference to FIGS. 3 and 4.

Upon reception of an "exposure" command from the CPU 316, the control system 313 sets, via the aperture control circuit 301, the width (to be referred to as a slit width hereinafter) of the aperture 201 of the aperture board 104 in the scanning direction (Y-direction), and the length (to be referred to as a slit length hereinafter) in a direction (X-direction) perpendicular to the scanning direction.

Figure 5:
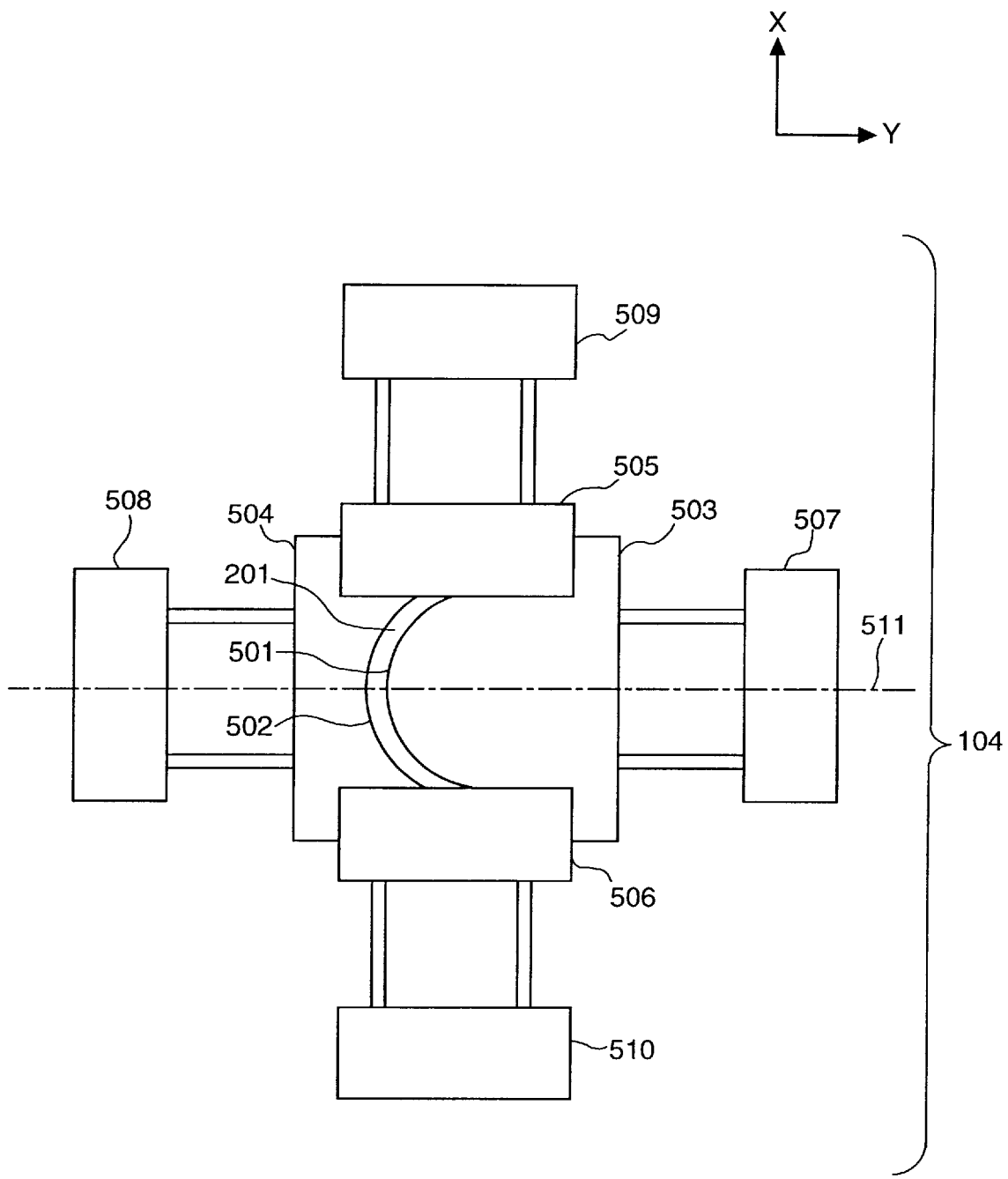
FIG. 5 is a plan view showing Example 1 of an aperture board of the first embodiment.

FIG. 5 shows an example of the aperture board 104. As shown in FIG. 5, the aperture board 104 of this embodiment makes the slit width of the arcuated aperture 201 constant in the longitudinal direction of the aperture by setting a blade 503 having an edge that inscribes an arc 501, and a blade 504 having an edge that circumscribes an arc 502 having the same radius as that of the arc 501 so as to be separated by a desired distance. On the other hand, the slit length of the aperture 201 is defined by blades 505 and 506.

The control system 313 instructs the aperture control circuit 301 to control a blade driver 507 and/or a blade driver 508 on the basis of information associated with the sensitivity of the resist used or the intensity of electron beams to be irradiated, thereby adjusting the slit width of the arcuated aperture 201. With this control, an optimal exposure amount corresponding to the chip size can be set.

Also, the control system 313 instructs the aperture control circuit 301 to control blade drivers 509 and 510 on the basis of the pattern width upon scanning the chip, thereby adjusting the slit length of the arcuated aperture 201.

A case will be examined below wherein the reduction ratio of the reduction electron optical system 108 is set at ½, as described above, the pattern width of the device chip to be exposed onto the wafer is 20 mm (40 mm on the mask), and the mask formed by dividing the pattern of the device chip into 10-mm wide small regions is used. In this case, the control system 313 instructs the aperture control circuit 301 to control the blade drivers 509 and 510 on the basis of the width (10 mm) of each small region on the mask, thereby setting-the slit length of the aperture 201 at 10 mm.

In this embodiment, the arcs 501 and 502 have a radius of 8 mm. Needless to say, the radius of the arc is set to fall within the range which is smaller than the radius of an allowable maximum exposure region of the arrangement of the reduction electron optical system 108, and is larger than ½ the width of each scanning region 401. Note that reference numeral 511 in FIG. 5 denotes the central line of the scanning direction.

The control system 301 synchronously moves the mask and wafer stages 106 and 116 via the mask and wafer stage driving control circuits 302 and 308 in the scanning directions 121 and 122, so that the pattern in one of the four small regions formed on the mask 105 passes above the electron beam irradiation region 202, thereby transferring the pattern onto the wafer 114 by scanning exposure. In this case, the control system 301 detects the positions of the mask and wafer stages 106 and 116 using the first and second laser interferometers 303 and 309 to detect the position deviation from a desired positional relationship between the mask and wafer stages 106 and 116, and corrects the position of the pattern image to be transferred onto the wafer 114 to a desired position using the position correction deflector 112 via the deflection position correction circuit 305. Upon completion of transfer of one small region, the control system 301 steps the mask and wafer stages 106 and 116 in directions perpendicular to their scanning directions via the mask and wafer stage driving control circuits 302 and 308, reverses the scanning directions, and then scans and exposes the pattern in the next small region to transfer it onto a region corresponding to that pattern on the wafer in the same manner as the previous small region. The small regions are sequentially scanned, and upon completion of scanning and exposing all the small regions (four exposure scans), the device pattern is formed by exposure on the wafer 114.

Normally, in the electron beam exposure apparatus, the pattern on the mask 105 is registered with and transferred by exposure onto a pattern pre-formed on the wafer 114. In this case, the two patterns must be registered or aligned with high precision. However, since the wafer 114 has already been subjected to the pattern formation process, and the wafer itself has expanded or shrunk, the registration precision lowers even when the pattern on the mask is transferred by exposure in the designed reduction ratio.

In view of this problem, the control system 313 acquires the expansion/shrinkage ratio of the wafer 114 to be exposed, and adjusts the magnification of the reduction electron optical system 108 via the magnification control circuit 307 on the basis of the acquired expansion/shrinkage ratio. At the same time, the control system 313 changes the setup state of the wafer stage driving control circuit 308 to attain a scanning speed of the wafer stage 116 corresponding to the set magnification, and also changes the step moving distance of the wafer stage 116 on the basis of the set magnification.

The reduction ratio of this embodiment is ½. The merit obtained when a small reduction ratio is not set, e.g., the reduction ratio is not set at ⅕ or ¹/₁₀ is that the speed of the mask stage 106 does not become high. Since the mask stage must be driven in at least two orthogonal directions in vacuum, as described above, size and weight reductions are limited, and hence, the driving speed of the mask stage is limited.

In estimation of this embodiment, the driving speed of the mask stage is the rate-determining factor for the throughput. In estimation of this embodiment, the mask stage is moved at a speed of 200 mm/sec in the scanning direction. At this time, the wafer stage moves at 100 mm/sec. Exposure for one chip is done by scanning the mask and wafer a total of four times by reciprocally moving them twice. In this case, the exposure time is 1.4 sec (0.35 sec/scan×4), and the time required for reversing the mask and wafer stages is 0.75 sec (about 0.25 sec×3). Hence, exposure for one chip can be completed in 2.15 sec.

The reason why the device pattern having a substantially rectangular region is divided in its widthwise direction (to leave the reinforcement beams in its longitudinal direction) is to reduce the number of scans. The scanning time required for irradiating the beam onto the entire surface of the chip remains the same independently of the scanning direction, and a time loss is produced by reversing the mask and wafer stages in the scanning direction (Y-direction) and stepping them in the X-direction. Hence, in order to improve the throughput, the number of times of reversing must be reduced.

EXAMPLE 2

In order to broaden the one-shot exposure region of the reduction electron optical system, aberrations must be reduced over a broad range as in Example 1. At the same time, the intensity of electron beams to be irradiated within the exposure region must be made uniform. In a narrow exposure region as in the prior art, electron beams are isotropically expanded, and are partially used to make the intensity of the electron beams to be irradiated uniform. However, when the exposure region is broad, nonuniformity of the intensity of the electron beams to be irradiated within the exposure region cannot be ignored.

In this manner, when electron beams within the exposure region suffer illuminance nonuniformity, the illuminance nonuniformity in the scanning direction can be ignored by exposure scans, but that in the direction perpendicular to the scanning direction cannot be corrected by the aperture 201 defined by the four blades in Example 1.

Figure 6A:
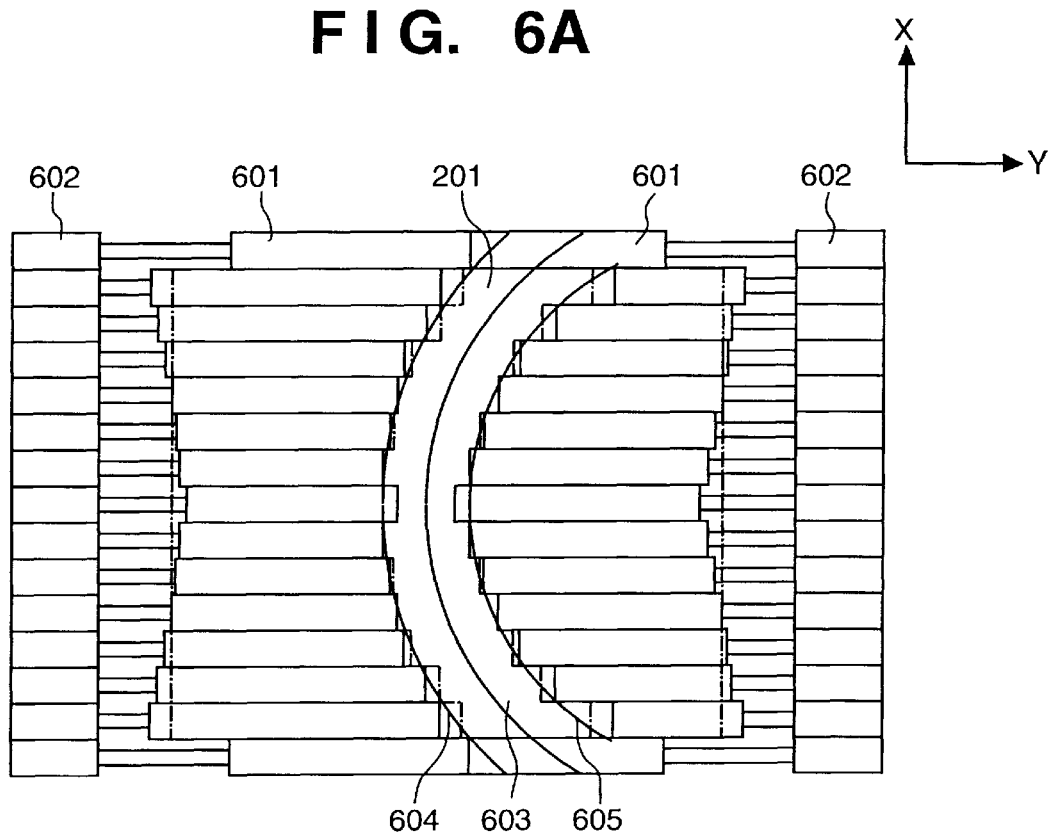
FIGS. 6A and 6B are views showing Example 2 of the aperture board of the first embodiment.

In order to solve this problem, Example 2 uses the arrangement of the aperture board 104 shown in FIG. 6A. Other arrangements are the same as those in Example 1. In this example, aperture blades are made up of thin, movable blades which are divided in the direction perpendicular to the scanning direction, and the slit width of the aperture 201 can be individually set in units of positions in the direction (X-direction) perpendicular to the scanning direction. In FIG. 6A, reference numeral 601 denotes aperture blades; 602, blade drivers for moving the aperture blades back and forth; and 603, a dotted curve that represents an arc (circle) having the axis of the electron optical system as the center. As shown in FIG. 6A, the plurality of strip-shaped movable aperture blades 601 and blade drivers 602 are arranged, and are set on the two sides of the predetermined arc 603 to be separated by equal distances therefrom, thereby forming an aperture 201 having a shape approximate to an arc.

Figure 6B:
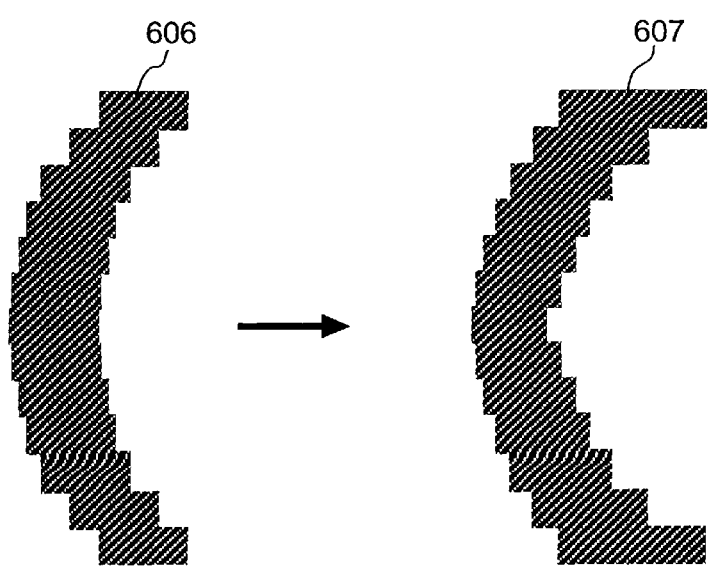

FIG. 6B shows the shape of the aperture formed in this example. In FIG. 6A, reference numerals 604 and 605 denote lines separated by equal distances from the arc 603 in the scanning direction. When the aperture blades are set at positions indicated by the dotted lines in FIG. 6A, an aperture having a shape 606 is formed. This shape is used when electron beams are free from any illuminance nonuniformity. In contrast to this, when electron beams suffer illuminance nonuniformity, and when the aperture blades 601 are set, as indicated by the solid lines in FIG. 6A, an aperture having a shape 607 in FIG. 6B is formed. This setting example of the slit width of the aperture is suitable for a case wherein the beam intensity is high at the central portion and is low at the peripheral portion.

In this manner, since the movable aperture blades 601 are used, even when electron beams suffer illuminance nonuniformity, a nearly equal exposure amount can be set within the irradiation region, and electron beams can be used more efficiently. As shown in FIG. 6A, as the number of divisions of the movable aperture blades is larger, illuminance nonuniformity can be removed with higher precision.

Furthermore, even when electron beams are free from any illuminance nonuniformity, if electron beams suffer transmittance nonuniformity due to the thickness nonuniformity of the mask membrane, in other words, substantially suffer illuminance nonuniformity, such nonuniformity can be similarly removed.

Also, when four blades at the two ends are set to contact each other, as shown in FIG. 6A, the slit length can be adjusted stepwise and, hence, the need for the slit length setting blades 505 and 506 in FIG. 5 in Example 1 can be obviated.

EXAMPLE 3

One characteristic feature of the present invention is suppressed current density due to a broad one-shot exposure region of the reduction electron optical system. With this feature, image blur caused by the Coulomb effect can be suppressed. The present invention is superior to conventional electron beam drawing using a point beam or cell (block) pattern transfer exposure in this respect as well.

Even in this method which is greatly advantageous as compared to the conventional methods, the amount of electron beams irradiated onto the wafer varies depending on the pattern to be transferred. This is because the mask always moves above the irradiation region extracted by the aperture. In this case, since the mask pattern density and the ratio of transmission and scattering above the irradiation region vary, the amount of electron beams irradiated onto the wafer varies, and consequently, a total current supplied from the mask onto the wafer varies, thus slightly shifting the focal point position of the reduction electron optical system. In this embodiment, information associated with the total current of electron beams incident on the wafer is acquired, and the focal point position of the reduction electron optical system is corrected on the basis of the information associated with the total current.

One method of acquiring the information associated with the total current is a method of using information of the pattern formed on the mask. That is, if the mask pattern density and the ratio of transmission and scattering above the irradiation region can be detected, the total current at that time can be estimated. Hence, the focal point position of the reduction electron optical system is corrected on the basis of the information of the total current estimated from the pattern located above the irradiation portion. This method will be explained below with reference to FIG. 3.

If the mask position can be detected, the mask pattern density and the ratio of transmission and scattering above the irradiation region can be detected and, hence, the total current at that time can be estimated. For this purpose, the mask position (coordinates) and information associated with the corresponding estimated total current are stored in the memory 314. Upon exposure, the control system 313 detects the position of the mask stage 106 using the first laser interferometer 303, and corrects the focal point position of the reduction electron optical system 108 using the focus correction lens 113 on the basis of the detected mask position and the estimated total current corresponding to the mask position stored in the memory 314.

Another method of acquiring the information associated with the total current is a method of directly detecting electrons scattered by the mask associated with the total current of electron beams incident on the wafer. That is, a sensor 111a connected to the scattered electron limit aperture 111 shown in FIG. 1 detects electrons scattered by the mask, and the control system 313 corrects the focal point position of the reduction electron optical system 108 on the basis of the detected current amount as in the above-mentioned method.

EXAMPLE 4

It is desirable to expose the widthwise direction of one, nearly rectangular device chip in a single scan by broadening the irradiation region, but it is very difficult to broaden the irradiation region up to such size in practice. As described above, in many cases, one device pattern must be exposed by performing a plurality of scans while stepping in a direction perpendicular to the scanning direction using the limited irradiation region. A problem posed in this case is stitching precision of patterns upon forming one device pattern. In the above-mentioned example, since one device pattern is formed by four scans, three stitching lines are formed. At this time, if the scanning position shifts albeit slightly, problems such as overexposure, disconnection (in the worst case), and the like are posed. It is very hard to attain scanning control that maintains a precision of $1/100$ to $1/1,000$ $\mu$m in stitching patterns.

In this example, as a method of reliably stitching patterns, the portions to be stitched are overlap-exposed. Since the exposure method of the present invention uses scanning exposure, the irradiation amount can be controlled by the slit width of the aperture. For this purpose, the area of the portion to be overlap-exposed for stitching patterns is set to be smaller (simply speaking, ½) than that of other portions to be exposed, thus preventing the exposure amount of the exposure region subjected to overlap exposure from becoming excessive, and avoiding the worst case such as disconnection even when the patterns to be stitched shift slightly.

Figure 7A:
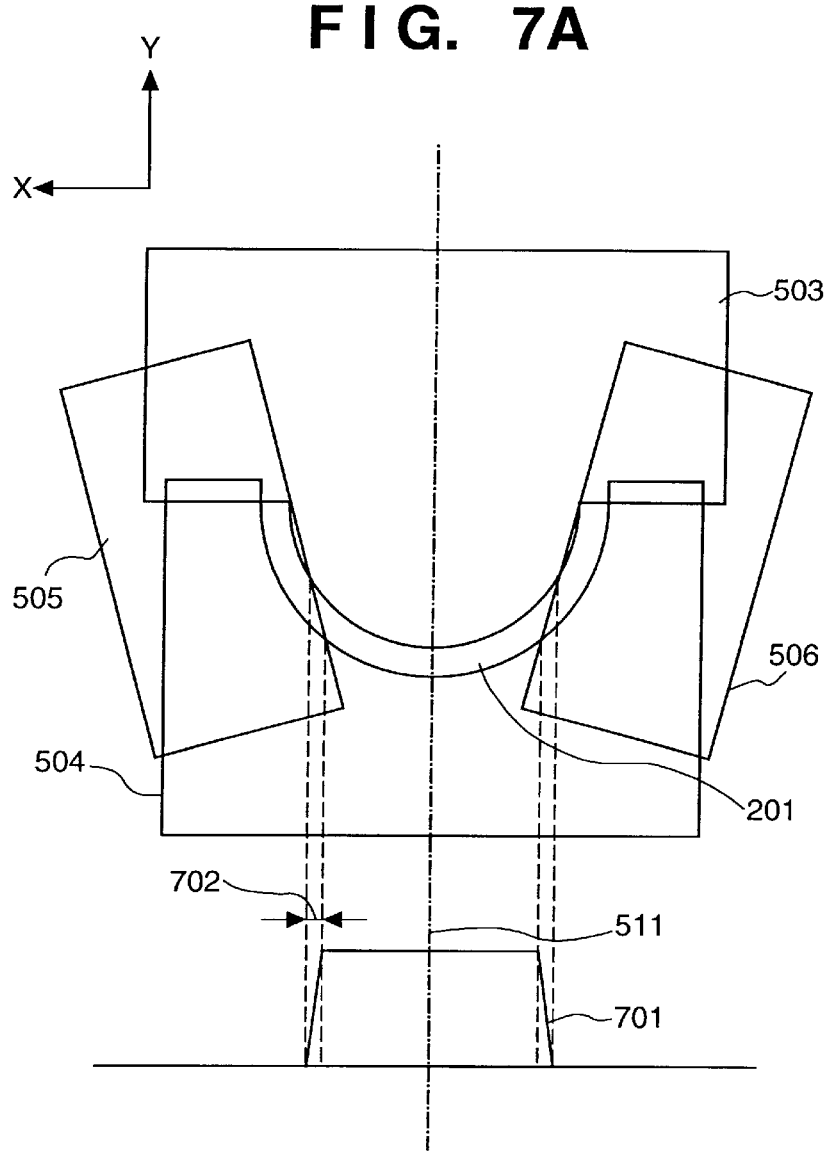
FIGS. 7A and 7B are views showing Example 4 of the aperture board of the first embodiment.

FIG. 7A shows the shape of the aperture 201 that determines the irradiation region of this embodiment. Reference numerals 503 and 504 denote movable blades that define the slit width; and 505 and 506, movable blades that define the slit length. In this case, the movable blades 505 and 506 have tilt with respect to the scanning direction (Y-direction). (Reference numeral 511 denotes the central line in the scanning direction.) With these blades, the slit width becomes gradually smaller toward one end in the scanning direction. Assuming that the width to be overlap-exposed for stitching patterns on the wafer is 5 $\mu$m and the slit width is 100 $\mu$m, the tilt of the blades 505 and 506 is 0.05 rad. In this arrangement, the length of the irradiation region formed by the aperture is 10.01 mm (10 mm (slit length)+2×5 $\mu$m (overlapping width)). The mask must have a structure corresponding to the irradiation region. As described above, since the divided patterns of one device pattern are formed in four regions, each of the divided patterns must partially overlap the neighboring patterns. In this example, a 5-$\mu$m wide overlapping region must be assured, and each of four windows on the mask must have at least a size of 10.01 mm×70 mm. Furthermore, when the mask has a relatively large region for overlap exposure with a margin, the region to be overlap-exposed can be appropriately selected in correspondence with the resolution or design value of the device pattern and the performance of the electron beam exposure apparatus.

Figure 7B:
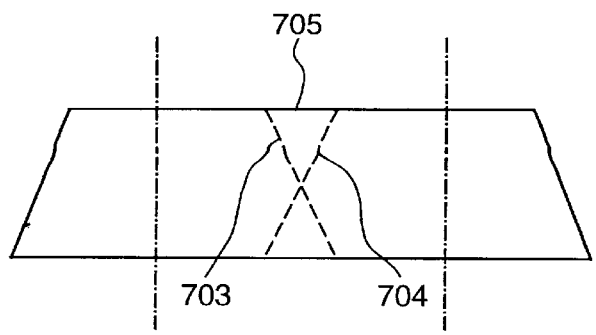

Reference numeral 701 denotes an exposure amount distribution in the direction of the slit length of this example; and 702, an overlapping region to be overlap-exposed. As described above, the structure having a slit width of the aperture in the region to be overlap-exposed, which becomes gradually smaller, forms a distribution in which the exposure amount gradually decreases at the two ends of the exposure region upon scanning. FIG. 7B shows the exposure amount distribution upon overlap exposure of this example. In FIG. 7B, a dotted line 703 represents the exposure amount distribution in the direction of the slit length in a certain scan, a dotted line 704 represents the exposure amount distribution in that direction in the next scan, and a solid line 705 represents the sum of these exposure amount distributions. As indicated by the solid line 705, since the exposure amount gradually changes at the overlapping portion of the distributions 703 and 704, an optimal exposure amount is obtained as a whole. Since the exposure amount gradually changes, even when the overlapping portion shifts with respect to the transfer line width within an allowable range, the exposure amount never drifts largely. In this manner, this example can solve the problem posed upon stitching patterns, and transfer can be satisfactorily realized even when the stepping method is used.

Second Embodiment

EXAMPLE 1

Figure 12:
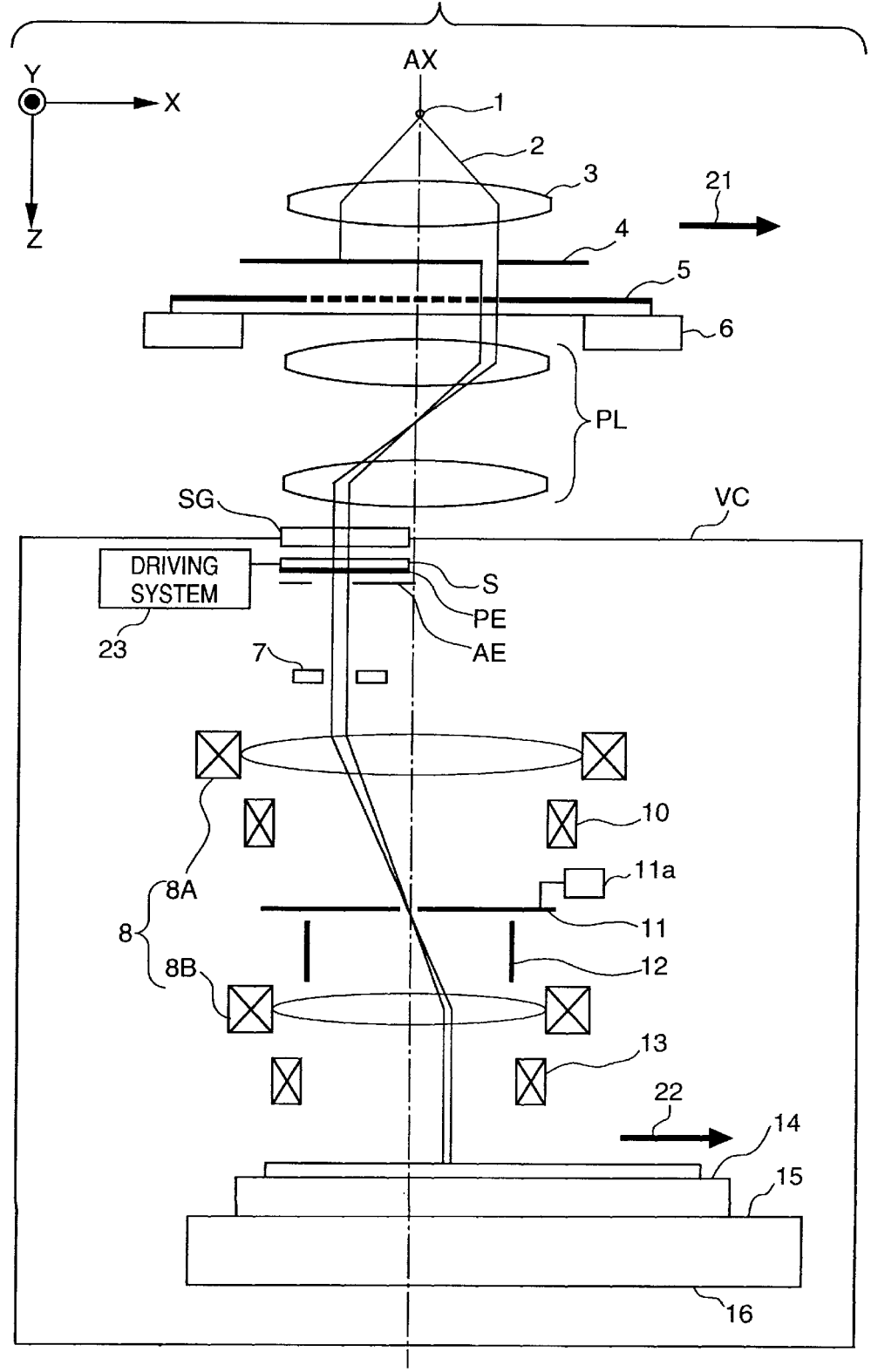
FIG. 12 is a diagram showing the arrangement of an electron beam exposure apparatus according to the second embodiment of the present invention.

FIG. 12 shows the arrangement of an electron beam exposure apparatus of the present invention. Light 2 coming from a light source that emits light (g-line, i-line, or excimer light) or a secondary light source 1 enters an aperture board 4 via an illumination optical system 3. The detailed arrangement of the aperture board 4 will be described later. The aperture board 4 has an arcuated aperture, extracts light into an arcuated region (which is sandwiched between two arcs having, as the center, an optical axis AX common to a projection optical system PL and a reduction electron optical system 8; to be described later) using the aperture, and guides the extracted light toward a mask 5 formed with a pattern defined by light transmission portions and light shielding portions. The mask 5 is placed on a mask stage 6 which is movable in at least in the X- and Y-directions.

The mask 5 is illuminated with the light having the arcuated illumination region, and a pattern image on the mask 5 is projected onto a photoelectric conversion surface PE via the projection optical system PL. The photoelectric conversion surface PE is prepared by forming a photoelectric conversion material that emits electrons upon reception of light on the surface of an optical transparent member S, and emits electron beams corresponding to the pattern image on the mask 5. The photoelectric conversion surface PE and the optical transparent member S make up a photoelectric conversion member. The photoelectric conversion member emits electron beams corresponding to the pattern image on the mask 5. Since the conversion efficiency of the photoelectric conversion surface PE as the ratio of the converted electron amount to the incident light amount deteriorates over time, a driving system 23 for rotating (moving) or vibrating the photoelectric conversion member for preventing light from being irradiated onto an identical region on the photoelectric conversion surface is connected to the photoelectric conversion member. Furthermore, in consideration of the service life of the photoelectric conversion member, a load/lock function is preferably provided, so that the photoelectric conversion member can be exchanged.

The optical transparent member S preferably uses a material with a high refractive index. When a glass substrate with a high refractive index is used, the NA (NA×nθ) increases, and the resolution of the pattern image formed on the photoelectric conversion surface can be improved.

Electron beams coming from the arcuated region (which is sandwiched between two arcs having, as the center, the optical axis AX of the reduction electron optical system 8; to be described later) on the photoelectric conversion surface PE are accelerated by an acceleration electrode AE (acceleration voltage V0), and are imaged on a wafer 14 via the reduction electron optical system 8 made up of electron lenses 8A and 8B. In this case, the electron beams are imaged on the wafer 14 via an aberration correction optical system 7 that corrects any aberrations (especially, astigmatism) produced when the electron beams pass through the reduction electron optical system. The aberration correction optical system 7 comprises a unipotential lens made up of three electrodes (EL1, EL2, and EL3) each having an arcuated aperture 7a which is sandwiched between two arcs having the optical axis of the reduction electron optical system 8 as the center as in the aperture board 4, and does not shield electron beams coming from the photoelectric conversion surface PE, as shown in FIG. 13. The electrodes EL1 and EL3 are set at the same potential (V0) as that of the acceleration electrode AE, and the electrode EL2 is set at a potential V1 different from V0. As a result, the aberration correction optical system 7 makes up an electron lens that gives different divergent or convergent effects in the tangential and radius vector directions of the arcuated aperture, i.e., has different focal lengths in the tangential and radius vector directions of the arcuated aperture. In this embodiment, since the aberration correction optical system 7 is separated from the photoelectric conversion surface PE, the acceleration electrode AE is required. Alternatively, when the aberration correction optical system 7 is arranged in the vicinity of the photoelectric conversion surface PE, the electrode EL1 of the unipotential lens can also serve as the acceleration electrode AE, and the need for the acceleration electrode AE can be obviated. That is, the aberration correction optical system 7 can also serve as the acceleration electrode AE.

Reference numeral 10 denotes a rotation lens for rotating a pattern image formed by electron beams to be projected onto the wafer 14 and coming from the photoelectric conversion surface PE; 11, an angle limit aperture that limits the divergence angle of electron beams from the photoelectric conversion surface PE; 12, a position correction deflector for correcting the position of a pattern image formed by electron beams to be projected onto the wafer 14 and coming from the photoelectric conversion surface PE; and 13, a focus correction lens for correcting the focal point of the reduction electron optical system 8.

Reference numeral 15 denotes a wafer chuck that carries the wafer 14; and 16, a wafer stage which carries the wafer chuck, and is movable in the X- and Y-directions and a rotation direction in the X-Y plane.

In the above-mentioned arrangement, when the mask 5 and wafer 14 are synchronously moved at speeds corresponding to the synthesized reduction ratio of the projection optical system PL and reduction electron optical system 8 respectively in the directions of arrows 21 and 22, the pattern of the arcuated region on the mask 5 is sequentially transferred by exposure onto the wafer 14.

Note that a portion surrounded by a frame VC in FIG. 12 is set in a high-vacuum chamber, and light coming from the projection optical system PL is guided onto the photoelectric conversion surface PE in the vacuum chamber via seal glass SG.

Figure 14:
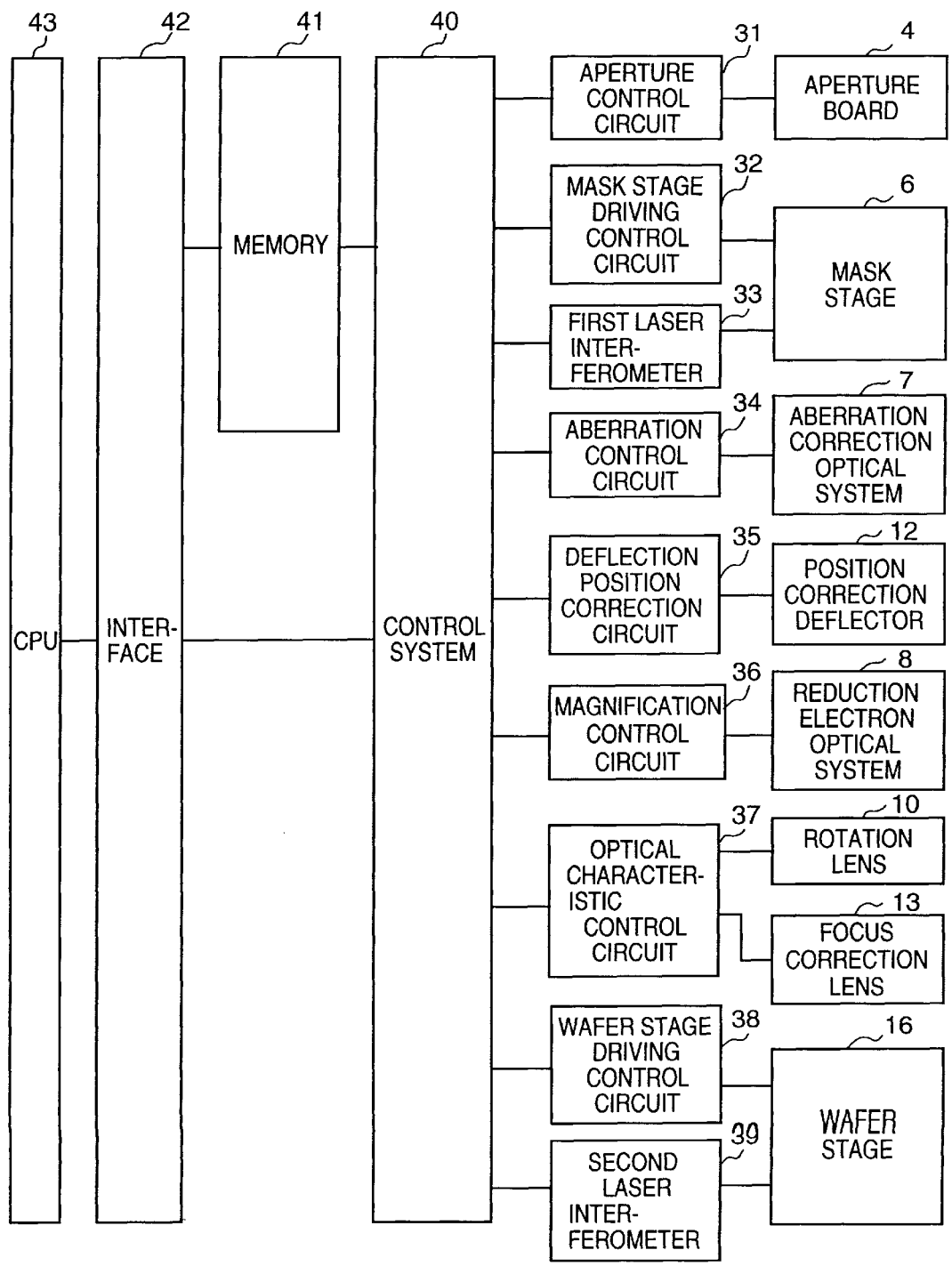
FIG. 14 is a block diagram showing the arrangement of principal part of the electron beam exposure apparatus of the second embodiment.

FIG. 14 is a block diagram showing the arrangement of principal part of the electron beam exposure apparatus of this embodiment. The same reference numerals in FIG. 14 denote the same parts as in FIG. 12, and a detailed description thereof will be omitted.

Reference numeral 31 denotes a control circuit for controlling the aperture shape of the aperture board 4; 32, a mask stage driving control circuit for controlling the movement of the mask stage 6; 33, a first laser interferometer for measuring the position of the mask stage 6 in real time; 34, an aberration control circuit for controlling the aberration characteristics of the aberration correction optical system 7; 35, a deflection position correction circuit for controlling the position of a pattern image to be projected onto the wafer 14 using the position correction deflector 12; 36, a magnification control circuit for controlling the magnification (reduction ratio) of the reduction electron optical system 8; 37, an optical characteristic control circuit for controlling the rotation lens 10 and the focus correction lens 13 to adjust the optical characteristics (focal point position, rotation of an image) of the reduction electron optical system 8; 38, a wafer stage driving control circuit for controlling the movement of the wafer stage 16; 39, a second laser interferometer for measuring the position of the wafer stage 16 in real time; 40, a control system for controlling the above-mentioned arrangement; 41, a memory that stores control data of the control system 40; 42, an interface; and 43, a CPU for controlling the entire electron beam exposure apparatus.

Exposure in this embodiment will be explained below with reference to FIG. 14.

Upon reception of an "exposure" command from the CPU 43, the control system 40 sets, via the aperture control circuit 31, the width (slit width) of an aperture 4a of the aperture board 4 in the scanning direction (X-direction), and the length (slit length) in a direction (Y-direction) perpendicular to the scanning direction.

Figure 15:
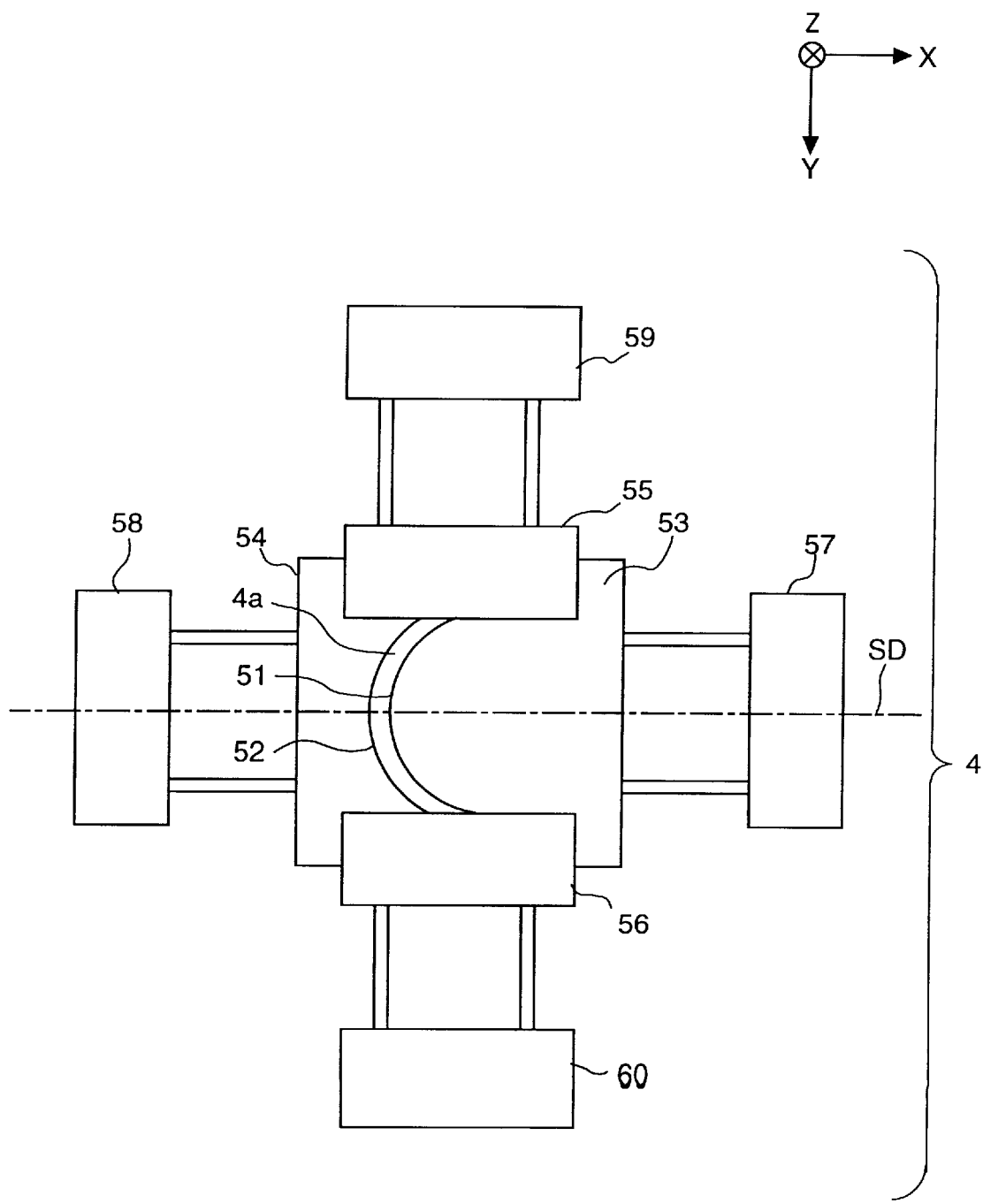
FIG. 15 is a plan view showing the arrangement of an aperture board of the second embodiment.

FIG. 15 shows an example of the aperture board 4. As shown in FIG. 15, the aperture board with this arrangement makes the slit width of the arcuated aperture 4a constant in the longitudinal direction of the aperture by setting a blade 53 having an edge that inscribes an arc 51, and a blade 54 having an edge that circumscribes an arc 52 having the same radius as that of the arc 51 so as to be separated by a desired distance. Furthermore, at least one of these blades 53 and 54 is movable, and the control system 40 instructs the aperture control circuit 31 to adjust the slit width of the arcuated aperture 4a on the basis of information associated with the sensitivity of the resist used or the intensity of electron beams to be irradiated, thereby setting an optimal exposure amount. Also, as shown in FIG. 15, by adjusting the interval between blades 55 and 56, an optimal slit length of the arcuated aperture 4a can be set in correspondence with the chip size. In FIG. 15, reference numerals 57 to 60 denote drivers for the blades 53 to 56, respectively, which drivers are controlled by the aperture control circuit 31. Note that SD is the central line in the scanning direction.

Note that the aperture board 4 may use the arrangements described in the first embodiment.

Figure 16:
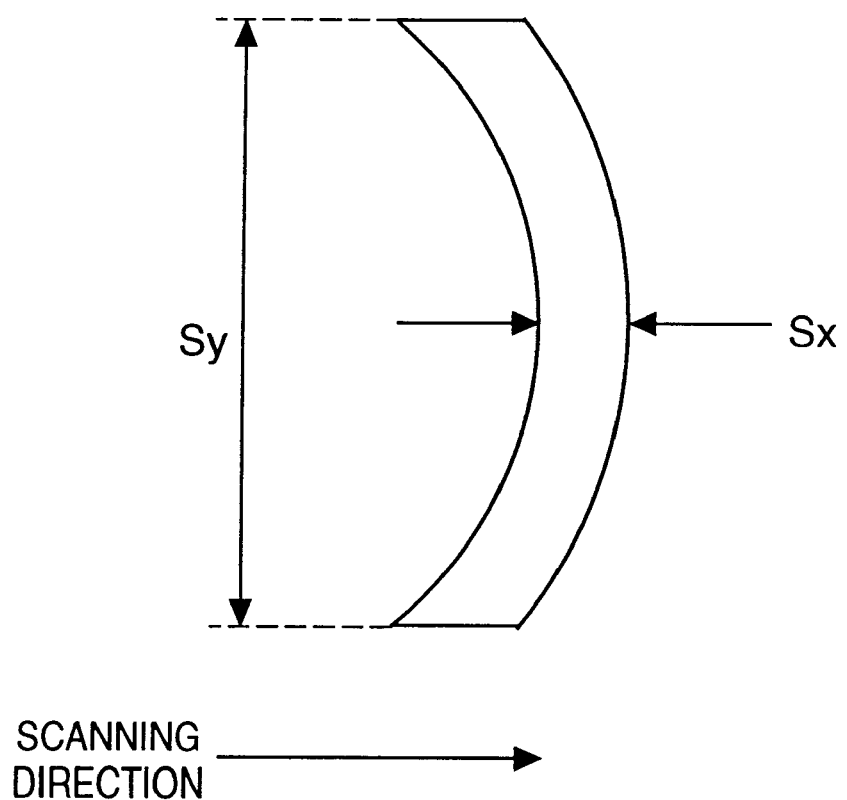
FIG. 16 is an explanatory view of an arcuated exposure region.

FIG. 16 is an enlarged view of the arcuated exposure region formed on the wafer due to the aperture 4a. Sx indicates the width of the arcuated exposure region in the scanning direction, and Sy indicates the length of the arcuated exposure region in the direction perpendicular to the scanning direction.

In this embodiment, by adjusting the aperture 4a, Sx can be set within the range from 0.1 mm to 1 mm, and Sy can be set within the range from 1 mm to 6 mm.

The control system 40 synchronously moves the mask and wafer stages 6 and 16 via the mask and wafer stage driving control circuits 32 and 38 in the scanning directions 21 and 22, so that the pattern in one of the four small regions obtained by dividing the pattern formed on the mask 5 passes above an irradiation region defined by the aperture 4a, thereby transferring the pattern onto the wafer 14 by scanning exposure. In this case, the control system 40 detects the positions of the mask and wafer stages 6 and 16 using the first and second laser interferometers 33 and 39 to detect the position deviation from a desired positional relationship between the mask and wafer stages 6 and 16, and corrects the position of the pattern image to be transferred onto the wafer 14 to a desired position using the position correction deflector 12 via the deflection position correction circuit 35. Upon completion of transfer of one small region, the control system 40 steps the mask and wafer stages 6 and 16 in directions perpendicular to their scanning directions via the mask and wafer stage driving control circuits 32 and 38, reverses the scanning directions, and then scans and exposes the pattern in the next small region to transfer it onto a region corresponding to that pattern on the wafer in the same manner as the previous small region. The small regions are sequentially scanned, and upon completion of scanning and exposing all the small regions, the device pattern is formed by exposure on the wafer 14.

Figure 17:
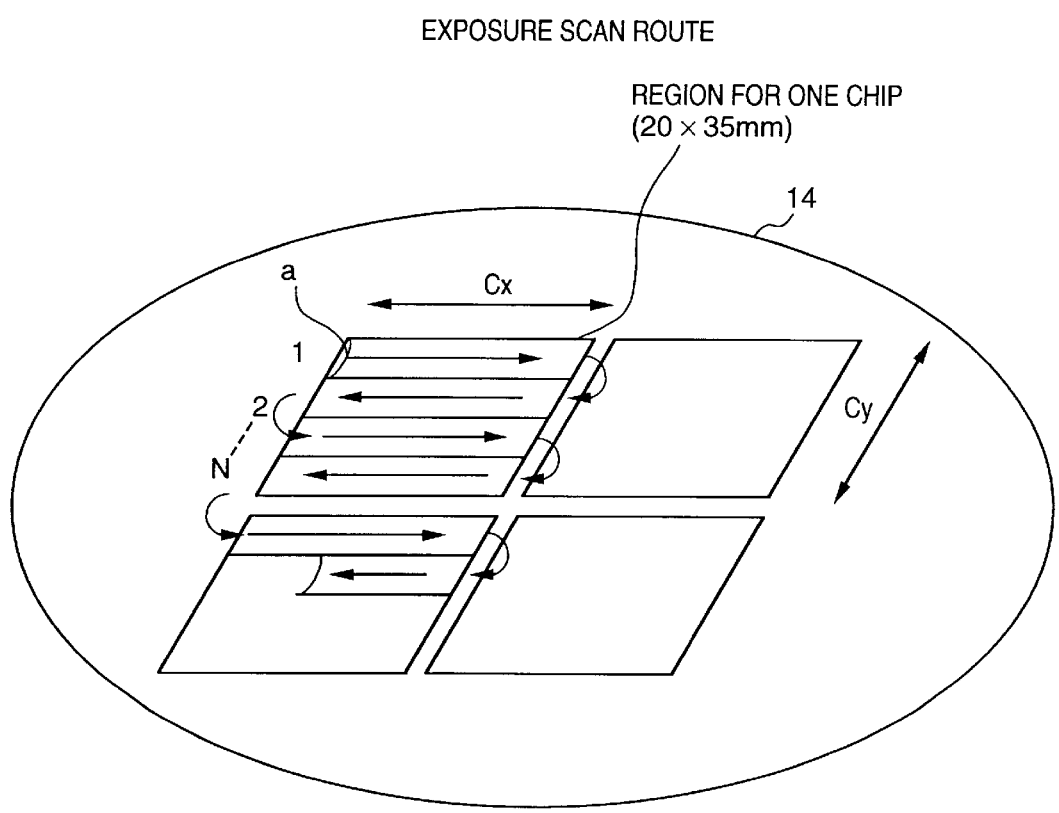
FIG. 17 is an explanatory view of an exposure scan route.

FIG. 17 shows the exposure scan route at that time. For example, the exposure scan route for a 20×35 (mm) chip will be examined below. The length Sy of the arcuated exposure region on the wafer 14 is set at 5 mm. In this case, the number of scan times is 20/5=4. Assuming that the position indicated by an arc a in FIG. 17 is an exposure start position, the wafer and mask stages 16 and 6 are scanned from that position in a direction Cx, and upon completion of the first scan, the two stages 6 and 16 are moved in a direction Cy (the direction perpendicular to the scanning direction) by 5 mm on the wafer and by 20 mm on the mask to locate the two stages at the start position of the second scan. The stages 6 and 16 are scanned in the direction opposite to that in the first scan. By repeating this operation, exposure for one chip is completed in a total of two reciprocal scans.

Normally, in the electron beam exposure apparatus, the pattern on the mask 5 is registered with and transferred by exposure onto a pattern pre-formed on the wafer 14. In this case, the two patterns must be registered with high precision. However, since the wafer 14 has already been subjected to the pattern formation process, and the wafer itself has expanded or shrunk, the registration precision lowers even when the pattern on the mask is exposed in the designed reduction ratio.

In view of this problem, the control system 40 acquires the expansion/shrinkage ratio of the wafer 14 to be exposed, and adjusts the magnification of the reduction electron optical system 8 via the magnification control circuit 36 on the basis of the acquired expansion/shrinkage ratio. At the same time, the control system 40 changes the setup state of the wafer stage driving control circuit 38 to attain a scanning speed of the wafer stage 16 corresponding to the set magnification, and also changes the step moving distance of the wafer stage 16 on the basis of the set magnification.

EXAMPLE 2

Even in this method which is greatly advantageous as compared to the conventional methods, the amount of electron beams irradiated onto the wafer varies depending on the pattern to be transferred. This is because the mask 5 always moves above the irradiation region extracted by the aperture. In this case, since the mask pattern density above the irradiation region varies, the amount of electron beams irradiated onto the wafer varies, and consequently, the total current supplied from the photoelectric conversion surface PE onto the wafer 14 varies, thus slightly shifting the focal point position of the reduction electron optical system. In this example, information associated with the total current of electron beams incident on the wafer is acquired, and the focal point position of the reduction electron optical system is corrected on the basis of the information associated with the total current.

One method of acquiring the information associated with the total current is a method of using information of the pattern formed on the mask 5. That is, if the mask pattern density above the irradiation region can be detected, the total current at that time can be estimated. Hence, the focal point position of the reduction electron optical system is corrected on the basis of the information of the total current estimated from the pattern located above the irradiation portion. This embodiment will be explained below with reference to FIG. 14.

If the position of the mask 5 can be detected, the mask pattern density above the irradiation region can be detected and, hence, the total current at that time can be estimated. For this purpose, the position of the mask 5 and information associated with the corresponding estimated total current are stored in the memory 41. Upon exposure, the control system 40 detects the position of the mask stage 6 using the first laser interferometer 33, and corrects the focal point position of the reduction electron optical system 8 using the focus correction lens 13 on the basis of the detected position of the mask 5 and the estimated total current corresponding to the position of the mask 5 stored in the memory 41.

Another method of acquiring the information associated with the total current is a method of directly detecting electrons emitted by the photoelectric conversion surface PE associated with the total current of electron beams incident on the wafer. That is, a sensor 11a connected to the angle limit aperture 11 shown in FIG. 12 directly detects electrons shielded by the angle limit aperture 11 of those emitted by the photoelectric conversion surface PE, and the control system 40 corrects the focal point position of the reduction electron optical system 8 on the basis of the detected current amount as in the above-mentioned method.

EXAMPLE 3

It is desirable to expose the widthwise direction of one, nearly rectangular device chip in a single scan by broadening the exposure region, but it is very difficult to broaden the exposure region up to such size in practice. As described above, in many cases, one device pattern must be exposed by performing a plurality of scans while stepping in a direction perpendicular to the scanning direction using the limited irradiation region. A problem posed in this case is stitching precision of patterns upon forming one device pattern. In the above-mentioned example, since one device pattern is formed by four scans, three stitching lines are formed. At this time, if the scanning position shifts albeit slightly, problems such as overexposure, disconnection (in the worst case), and the like are posed. It is very hard to attain scanning control that maintains a precision of $1/100$ to $1/1,000$ $\mu$m in stitching patterns.

In this example, as a method of reliably stitching patterns, the portions to be stitched are overlap-exposed. Since the exposure method of the present invention uses scanning exposure, the irradiation amount can be controlled by the slit width of the aperture. For this purpose, the area of the portion to be overlap-exposed for stitching patterns is set to be smaller (simply speaking, ½) than that of other portions to be exposed, thus preventing the exposure amount of the exposure region subjected to overlap exposure from becoming excessive, and avoiding the worst case such as disconnection even when the patterns to be stitched shift slightly.

Figure 18A:
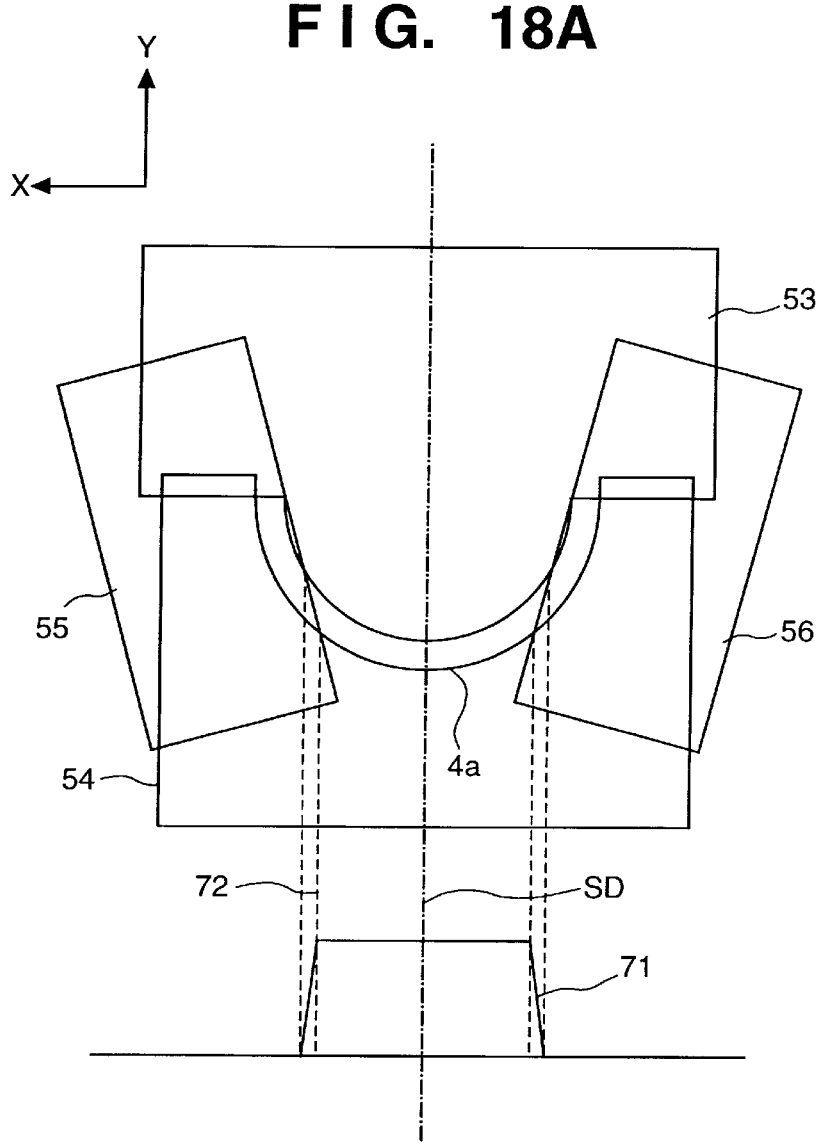
FIGS. 18A and 18B are views showing Example 3 of the aperture board of the second embodiment.

FIG. 18A shows the shape of the aperture 4a that determines the irradiation region of this embodiment. Reference numerals 53 and 54 denote movable blades that define the slit width; and 55 and 56, movable blades that define the slit length. In this case, the movable blades 55 and 56 have tilt with respect to the scanning direction (Y-direction). (SD indicates the central line in the scanning direction.) With these blades, the slit width becomes gradually smaller toward one end in the scanning direction. Assuming that the width to be overlap-exposed for stitching patterns on the wafer is 5 $\mu$m and the width Sx of the arcuated exposure region in the scanning direction is 100 $\mu$m, the tilt of each blade is 0.05 rad. In this arrangement, the length Sy of the arcuated exposure region, formed by the aperture 4a, in the direction perpendicular to the scanning direction is 10.01 mm. When the device pattern on the mask 5 is divided into four small regions and each of these small regions is illuminated, for example, 5-$\mu$m wide regions that allow overlap illumination are assured at the two side of each small region, thus selecting the region to be overlap-exposed in accordance with the minimum line width of the device pattern.

Figure 18B:
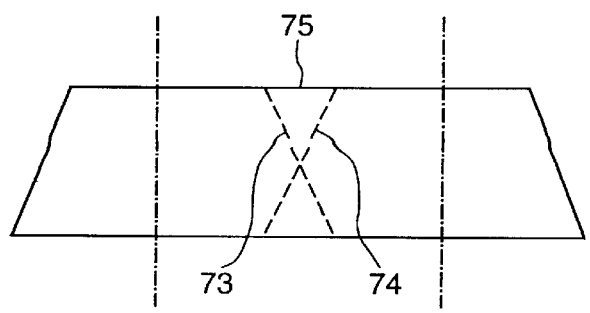

Reference numeral 71 denotes an exposure amount distribution of the arcuated exposure region of this example in a direction perpendicular to the scanning direction; and 72, an overlap illumination region to be overlap-exposed. As described above, the structure having a slit width of the aperture in the region to be overlap-exposed, which becomes gradually smaller, forms a distribution in which the exposure amount gradually decreases at the two ends of the exposure region upon scanning. FIG. 18B shows the exposure amount distribution upon overlap exposure of this example. In FIG. 18B, a dotted line 73 represents the exposure amount distribution in the direction of the slit length in a certain scan, a dotted line 74 represents the exposure amount distribution in that direction in the next scan, and a solid line 75 represents the sum of these exposure amount distributions. As indicated by the solid line 75, since the exposure amount gradually changes at the overlapping portion of the distributions 73 and 74, an optimal exposure amount is obtained as a whole. Since the exposure amount gradually changes, even when the overlapping portion shifts with respect to the transfer line width within an allowable range, the exposure amount never drifts largely. In this manner, this example can solve the problem posed upon stitching patterns, and transfer can be satisfactorily realized even when the stepping method is used.

Third Embodiment

Figure 19:
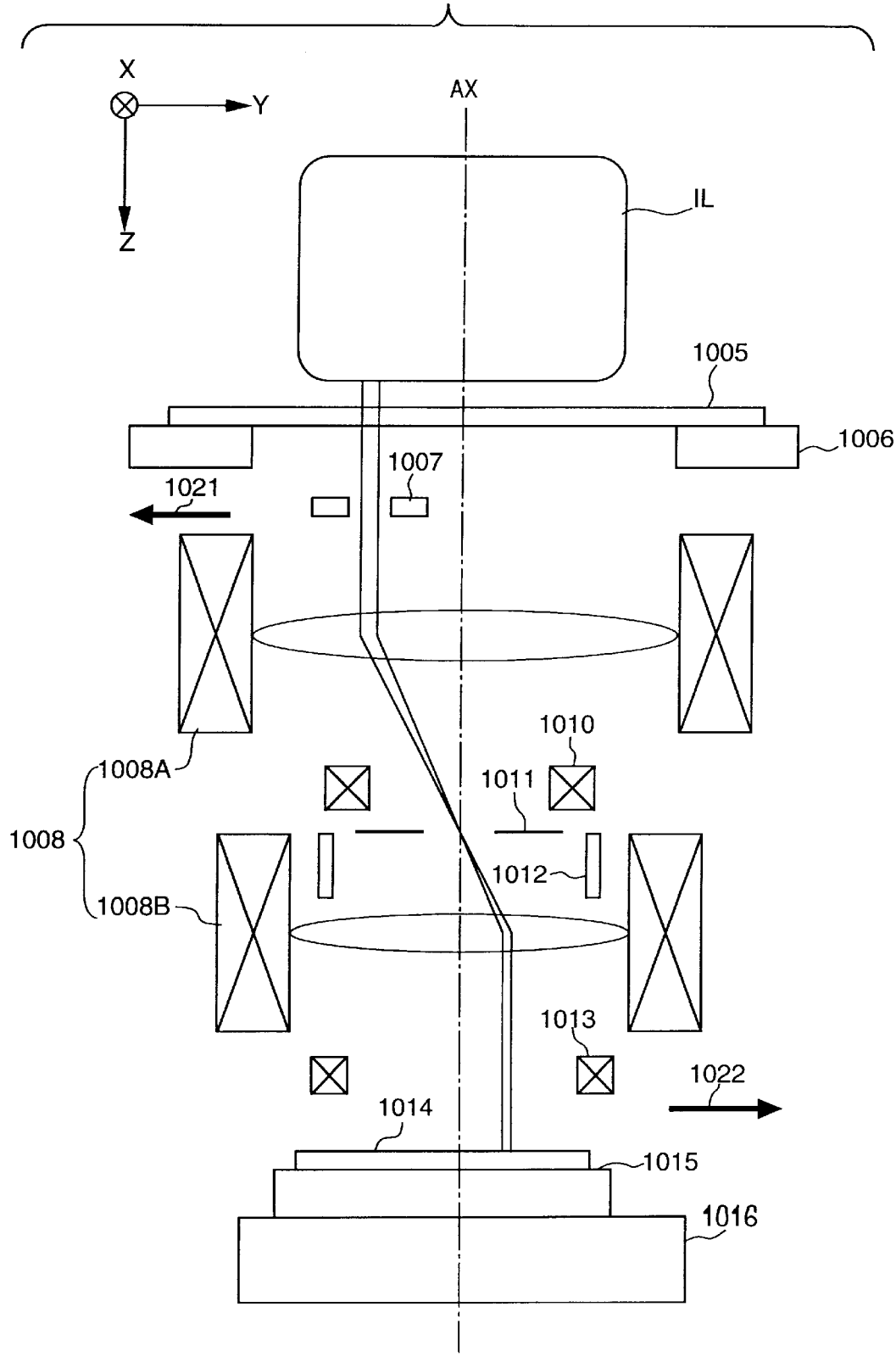
FIG. 19 is a diagram showing the arrangement of an electron beam exposure apparatus according to the third embodiment of the present invention.

FIG. 19 shows the arrangement of an electron beam exposure apparatus of the present invention. Reference symbol IL denotes an electron beam illumination apparatus for illuminating a mask 1005 formed with a pattern defined by electron beam transmission and shielding portions with electron beams in an arcuated illumination region sandwiched by two arcs having, as the center, an optical axis Ax of a reduction electron optical system 1008 (to be described later).

The electron beam illumination apparatus IL will be described in detail below with reference to FIG. 20.

Reference numeral 1001 denotes an electron gun as a so-called light source for emitting electron beams. Divergent electron beams emitted by the electron gun 1001 are converged by an electron lens 1003 as an electron optical system to be converted into electron beams nearly parallel to the optical axis AX. An optical axis AX' of the electron lens 1003 decenters from the optical axis AX of the reduction electron optical system 1008, and the electron gun 1001 is located on the optical axis AX' of the electron lens 1003.

The electron beams nearly parallel to the optical axis Ax pass through a first deflector DEF1 having two cylindrical surface electrodes (EP11 and EP12) having, as the center, the optical axis AX of the reduction electron optical system 1008, and are deflected in a radial direction having, as the center, the optical axis AX of the reduction electron optical system 1008. Then, the electron beams pass through a second deflector DEF2 having two cylindrical surface electrodes (EP21 and EP22) having, as the center, the optical axis AX of the reduction electron optical system 1008 as in the first deflector DEF1 and are deflected in a radial direction opposite to that of the first deflector DEF1. More specifically, the second deflector DEF2 applies an electric field to the optical axis AX of the reduction electron optical system 1008 in a direction opposite to that of the first deflector DEF1.

The electron beams deflected by the second deflector DEF2 become those nearly parallel to the optical axis AX of the reduction optical system 1008, and illuminate an aperture board 1004 that defines an illumination region of a mask 1005. The aperture board 1004 will be described in detail later.

Figure 20:
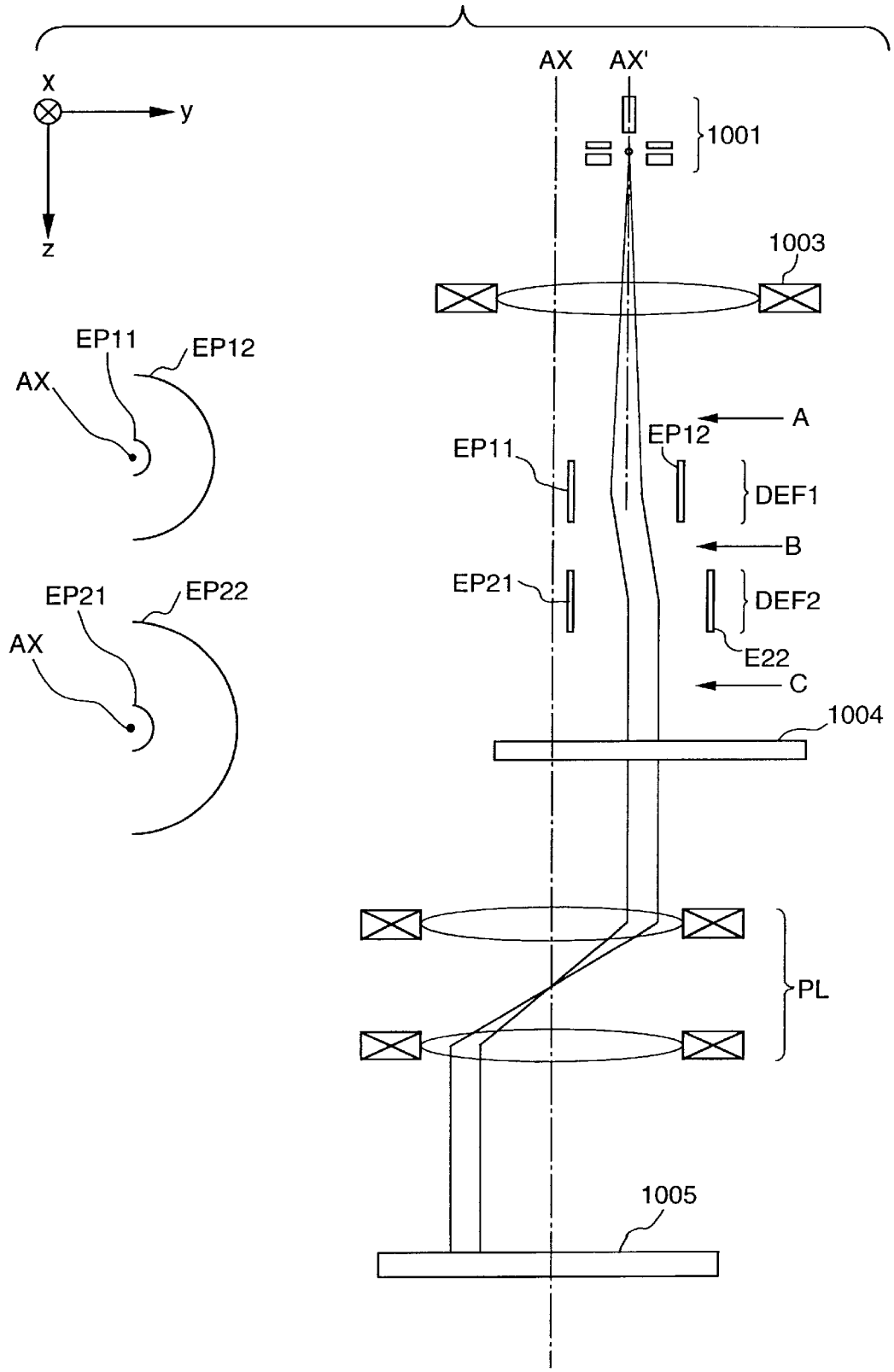
FIG. 20 is a diagram showing the arrangement of an electron beam illumination apparatus according to the third embodiment of the present invention.
Figure 21A:
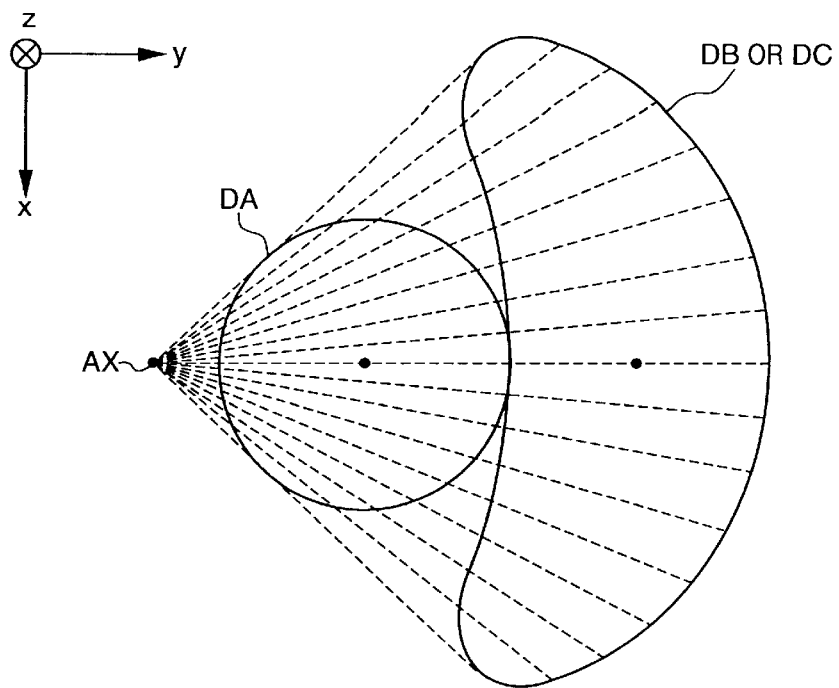
FIGS. 21A and 21B are views for explaining the functions of the electron beam illumination apparatus according to the third embodiment of the present invention.

At this time, the electron beams have a circular intensity distribution DA in FIG. 21A in a section indicated by an arrow A in FIG. 20. When the electron beams pass through the first deflector DEF1 and are deflected in the radial direction having, as the center, the optical axis AX of the reduction electron optical system 1008, they have an intensity distribution DB in FIG. 21A, which have a crescent-like shape having, as the center, the optical axis of the reduction electron optical system 1008 in a section indicated by an arrow B in FIG. 20. Furthermore, when the electron beams pass through the second deflector DEF2 and are deflected in the radial direction opposite to the first deflector DEF1, they have an intensity distribution DC nearly equal to the distribution DB in FIG. 21A in a section indicated by an arrow C in FIG. 20, and become those nearly parallel to the optical axis AX of the reduction electron optical system 1008.

Figure 21B:
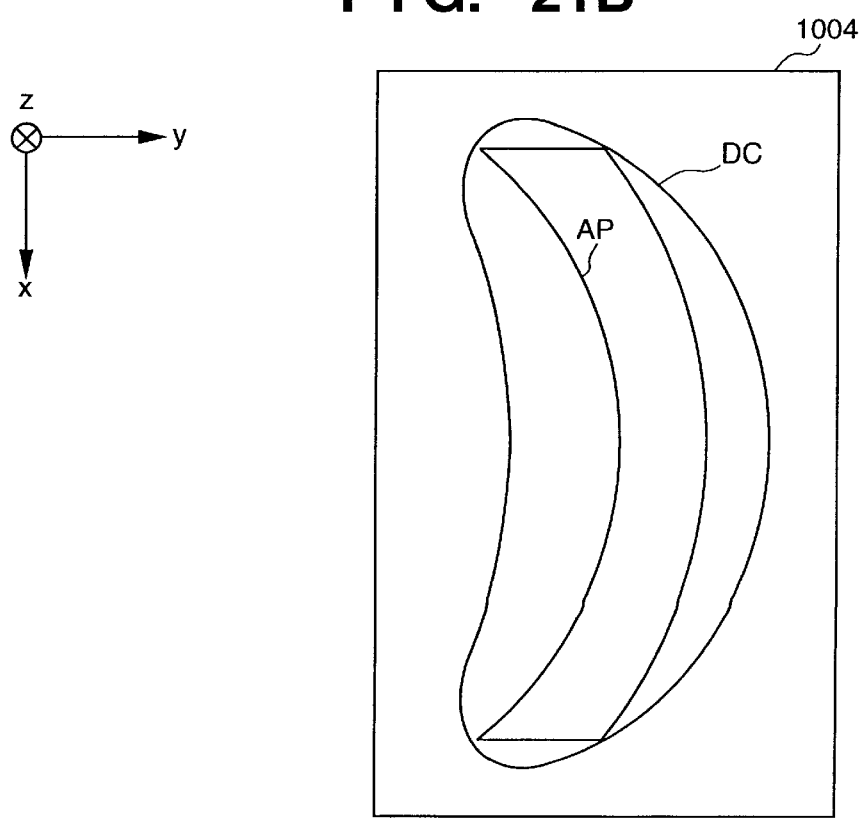

The electron beams with the crescent-like intensity distribution are extracted into a desired arcuated shape (an arcuated region sandwiched between two arcs having, as the center, the optical axis AX of the reduction electron optical system 1008) by an aperture AP of the aperture board 1004, as shown in FIG. 21B. Since the electron beams originally have a crescent-like intensity distribution near an arc, electron beams from the electron gun 1001 can be efficiently used when they are converted into desired arcuated electron beams.

The electron beams having acquired a desired arcuated intensity distribution via the aperture AP are imaged on the mask 1005 by a projection electron optical system PL, and illuminate an arcuated region sandwiched between two arcs having, as the center, the optical axis AX of the reduction electron optical system 1008. That is, the aperture board 1004 and the mask 1005 are set at electrooptically conjugate positions via the projection electron optical system PL.

The mask 1005 may use either a scattering type mask which has a scattering member pattern for scattering electron beams on a membrane that transmits the electron beams, or a stencil type mask prepared by forming a pattern aperture in a membrane that shields or attenuates the electron beams. This embodiment uses the scattering type mask. The mask 1005 is placed on a mask stage 1006 which is movable at least in the X- and Y-directions.

When the electron beams illumination apparatus IL illuminates the arcuated region on the mask 1005, electron beams coming from the arcuated region are imaged on a wafer 1014 via the reduction electron optical system 1008 made up of electron lenses 1008A and 1008B. In this case, the electron beams are imaged on the wafer 1014 via an aberration correction optical system 1007 that corrects any aberrations (especially, astigmatism) produced when the electron beams pass through the reduction electron optical system 1008. The aberration correction optical system 1007 comprises a unipotential lens made up of three electrodes (EL1, EL2, and EL3) each having an arcuated aperture which is sandwiched between two arcs having the optical axis AX of the reduction electron optical system 1008 as the center as in the aperture board 1004, and does not shield electron beams coming from the mask 1005, as shown in FIG. 22. The electrodes EL1 and EL3 are set at the same potential (V0) as that of an acceleration electrode AE, and the electrode EL2 is set at a potential V1 different from V0. As a result, the aberration correction optical system 1007 makes up an electron lens that gives different divergent or convergent effects in the tangential and radius vector directions of the arcuated aperture, i.e., has different focal lengths in the tangential and radius vector directions of the arcuated aperture.

This embodiment adopts a unipotential lens made up of three electrodes, but may adopt an electron lens made up of a single electrode having an arcuated aperture. That is, the potential of the electrode is set to accelerate or decelerate electron beams coming from the mask 1005, thus giving different divergent or convergent effects in the tangential and radial vector directions of the arcuated aperture.

Reference numeral 1010 denotes a rotation lens for rotating a pattern image on the mask 1005 to be projected onto the wafer 1014; 1011, a scattered electron limit aperture that shields electron beams transmitted through and scattered by the scattering member of the mask 1005 and transmits electron beams transmitted through a portion without any scattering member; 1012, a position correction deflector for correcting the position of a pattern image on the electron beam mask 1005 to be projected onto the wafer 1014; and 1013, a focus correction lens for correcting the focal point of the reduction electron optical system 1008.

Reference numeral 1015 denotes a wafer chuck that carries the wafer 1014; and 1016, a wafer stage which carries the wafer chuck, and is movable in the X- and Y-directions and a rotation direction in the X-Y plane.

In the above-mentioned arrangement, when the mask 1005 and wafer 1014 are synchronously moved at speeds corresponding to the reduction ratio of the reduction electron optical system 1008 respectively in the directions of arrows 1021 and 1022, the pattern of the arcuated region on the mask 1005 is sequentially transferred by exposure onto the wafer 1014.

Figure 23:
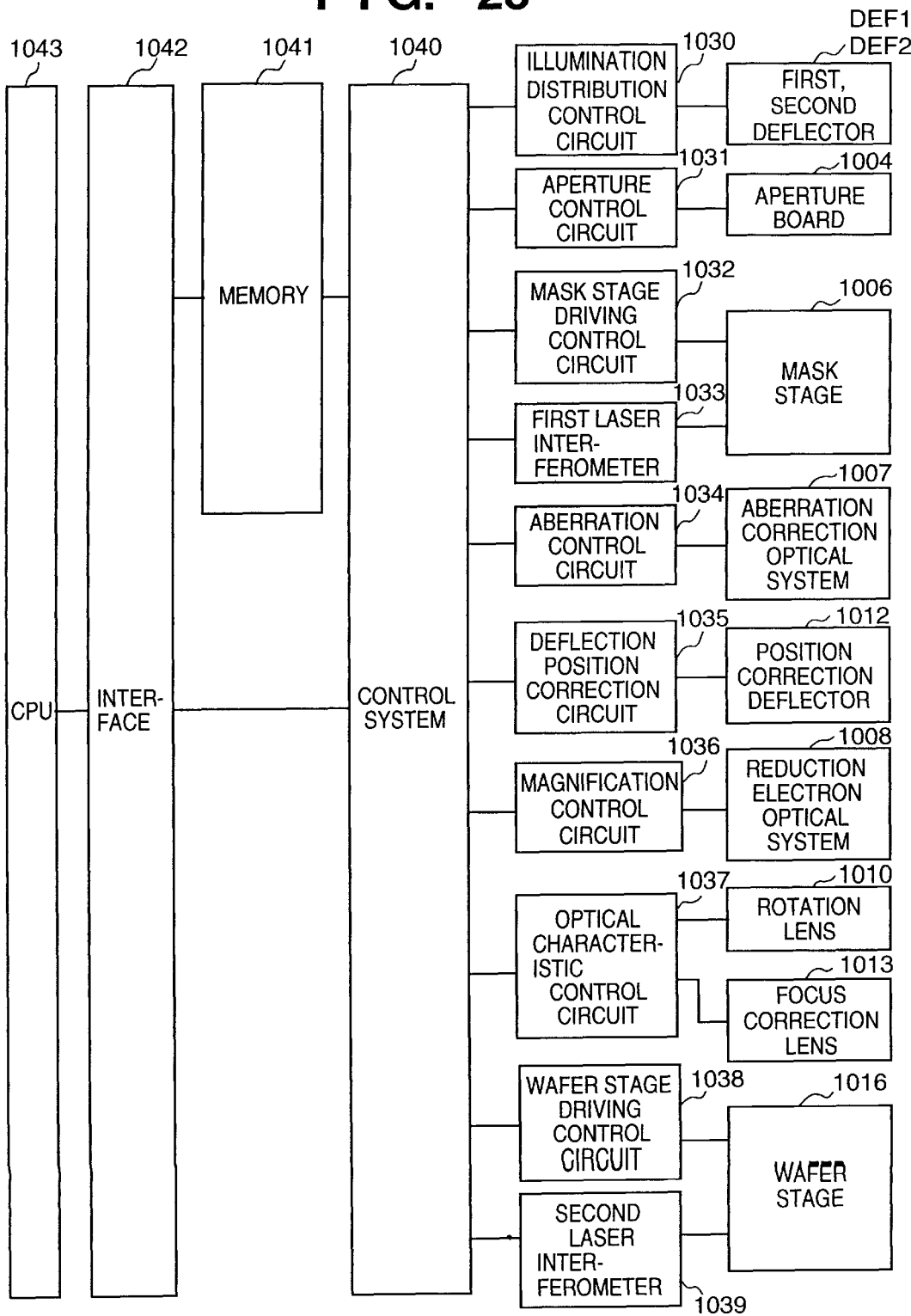
FIG. 23 is a block diagram showing the arrangement of principal part of the electron beam exposure apparatus according to the third embodiment of the present invention.

FIG. 23 is a block diagram showing the arrangement of principal part of the electron beam exposure apparatus of this embodiment. The same reference numerals in FIG. 23 denote the same parts as in FIGS. 19 and 20, and a detailed description thereof will be omitted.

Reference numeral 1030 denotes an illumination distribution control circuit for adjusting the intensity distribution of electron beams on the aperture board 1004 by controlling the deflection amounts of the first and second deflectors of the electron beam illumination apparatus IL; 1031, a control circuit for controlling the aperture shape of the aperture board 1004; 1032, a mask stage driving control circuit for controlling the movement of the mask stage 1006; 1033, a first laser interferometer for measuring the position of a mask stage 1006 in real time; 1034, an aberration control circuit for controlling the aberration characteristics of the aberration correction optical system 1007; 1035, a deflection position correction circuit for controlling the position of a pattern image to be projected onto the wafer 1014 using the position correction deflector 1012; 1036, a magnification control circuit for controlling the reduction ratio of the reduction electron optical system 1008; 1037, an optical characteristic control circuit for controlling the rotation lens 1010 and the focus correction lens 1013 to adjust the optical characteristics (focal point position, rotation of an image) of the reduction electron optical system 1008; 1038, a wafer stage driving control circuit for controlling the movement of the wafer stage 1016; 1039, a second laser interferometer for measuring the position of the wafer stage 1016 in real time; 1040, a control system for controlling the above-mentioned arrangement; 1041, a memory that stores control data of the control system 1040; 1042, an interface; and 1043, a CPU for controlling the entire electron beam exposure apparatus.

Exposure in this embodiment will be explained below with reference to FIG. 23.

Upon reception of an "exposure" command from the CPU 1043, the control system 1040 sets, via the aperture control circuit 1031, the width (slit width) of an aperture of the aperture board 1004 in the scanning direction (X-direction), and the length (slit length) in a direction (Y-direction) perpendicular to the scanning direction.

Figure 24:
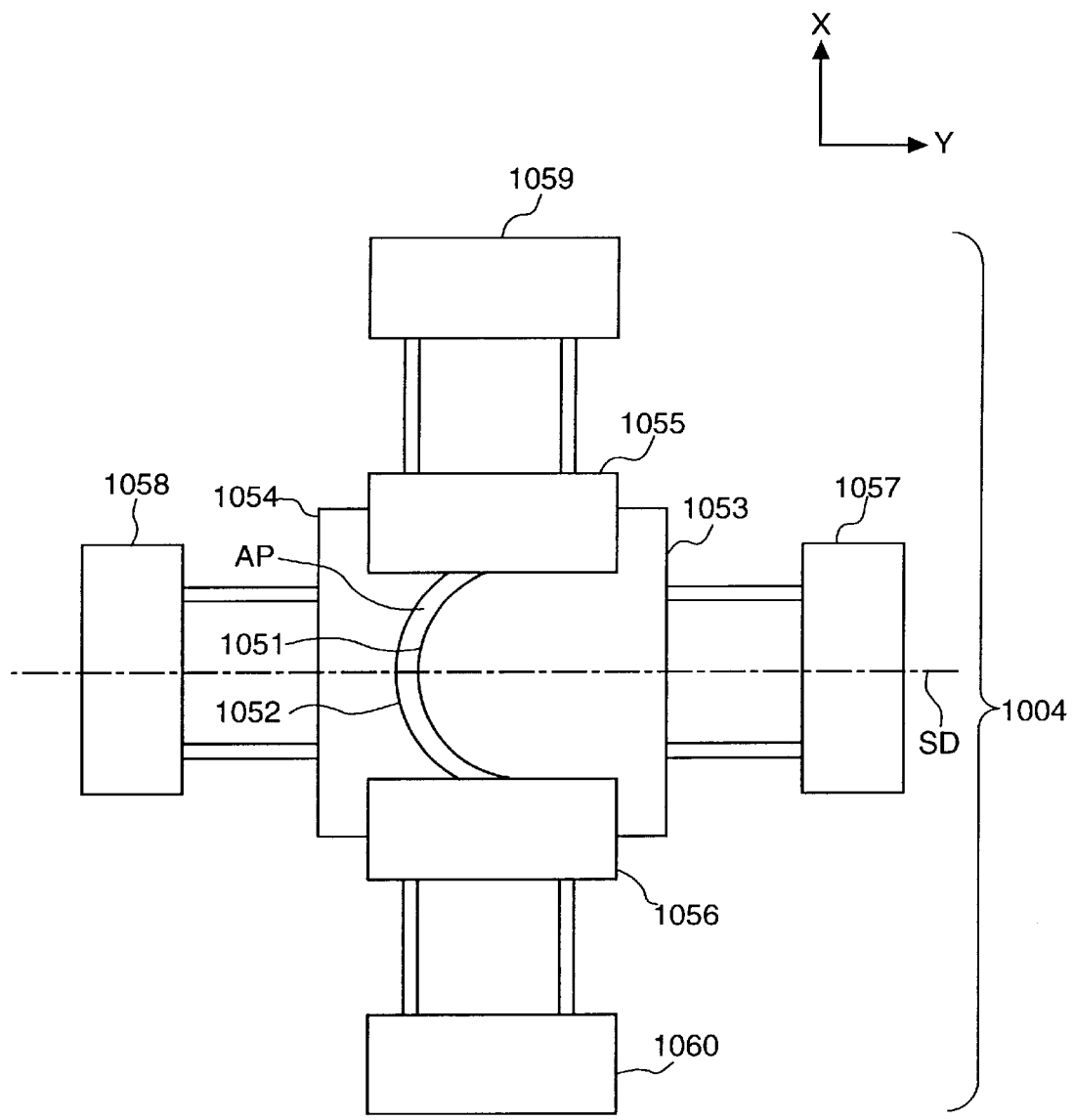
FIG. 24 is a plan view showing the arrangement of an aperture board.

FIG. 24 shows an example of the aperture board 1004. As shown in FIG. 24, the aperture board of this embodiment makes the slit width of the arcuated aperture AP constant in the longitudinal direction of the aperture by setting a blade 1053 having an edge that inscribes an arc 1051, and a blade 1054 having an edge that circumscribes an arc 1052 having the same radius as that of the arc 1051 so as to be separated by a desired distance. Furthermore, at least one of these blades 1053 and 1054 is movable, and the control system 1040 instructs the aperture control circuit 1031 to adjust the slit width of the arcuated aperture on the basis of information associated with the sensitivity of the resist used or the intensity of electron beams to be converted, thereby setting an optimal exposure amount. Also, as shown in FIG. 24, by adjusting the interval between blades 1055 and 1056, an optimal slit length of the arcuated aperture AP can be set in correspondence with the chip size. In FIG. 24, reference numerals 1057 to 1060 denote drivers for the blades 1053 to 1056, respectively, which drivers are controlled by the aperture control circuit 1031. Note that SD is the central line in the scanning direction.

Together with the adjustment of the shape of the aperture AP, the deflection amounts of the first and second deflectors (DEF1 and DEF2) are controlled by the illumination distribution control circuit 1030 to adjust the intensity distribution of electron beams that illuminate the aperture board 1004.

Figure 25:
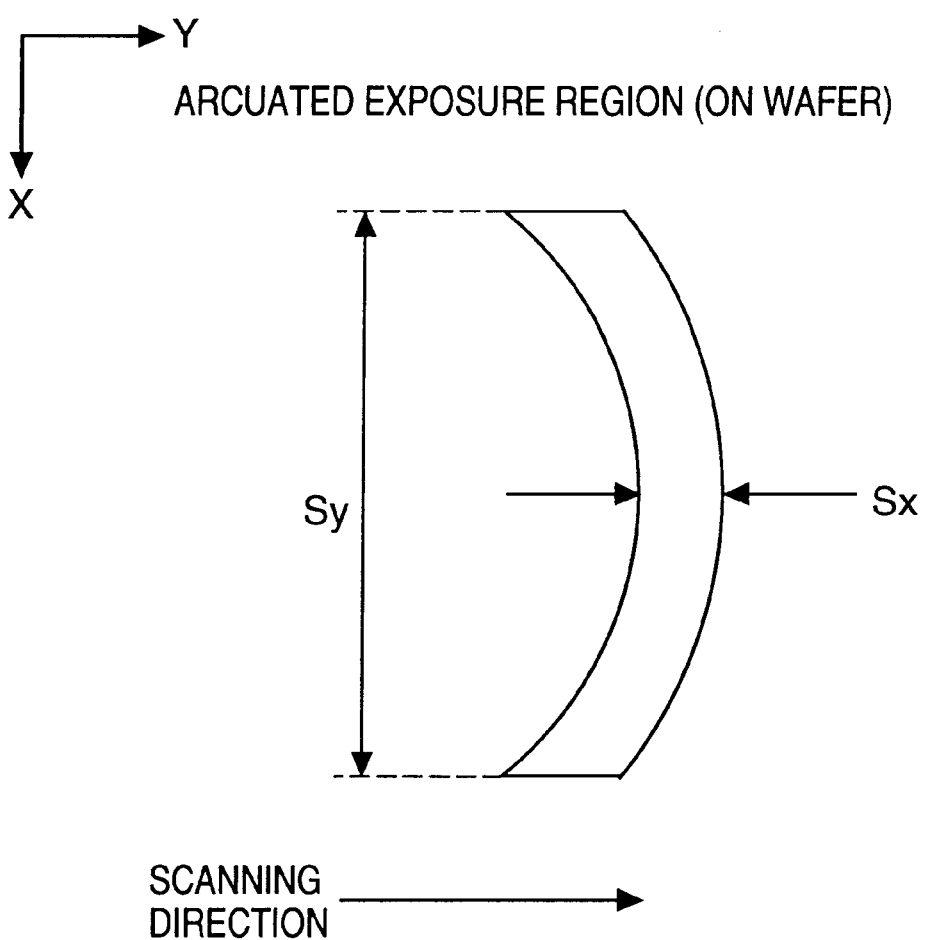
FIG. 25 is an explanatory view of an arcuated exposure region.

FIG. 25 is an enlarged view of the arcuated exposure region formed on the wafer due to the aperture board 1004. Sx indicates the width of the arcuated exposure region in the scanning direction, and Sy indicates the length of the arcuated exposure region in the direction perpendicular to the scanning direction.

In this embodiment, by adjusting the aperture AP of the aperture board 1004, Sx can be set within the range from 0.1 mm to 1 mm, and Sy can be set within the range from 1 mm to 6 mm.

The control system 1040 synchronously moves the mask and wafer stages 1006 and 1016 via the mask and wafer stage driving control circuits 1032 and 1038 in the scanning directions 1021 and 1022, so that the pattern in one of the four small regions obtained by dividing the pattern formed on the mask 1005 passes above an illumination region defined by the aperture AP, thereby transferring the pattern onto the wafer 1014 by scanning exposure. In this case, the control system 1040 detects the positions of the mask and wafer stages 1006 and 1016 using the first and second laser interferometers 1033 and 1039 to detect the position deviation from a desired positional relationship between the mask and wafer stages 1006 and 1016, and corrects the position of the pattern image to be transferred onto the wafer 1014 to a desired position using the position correction deflector 1012 via the deflection position correction circuit 1035. Upon completion of transfer of one small region, the control system 1040 steps the mask and wafer stages 1006 and 1016 in directions perpendicular to their scanning directions via the mask and wafer stage driving control circuits 1032 and 1038, reverses the scanning directions, and then scans and exposes the pattern in the next small region to transfer it onto a region corresponding to that pattern on the wafer in the same manner as the previous small region.

The small regions are sequentially scanned, and upon completion of scanning and exposing all the small regions, the device pattern is formed by exposure on the wafer 1014.

Figure 26:
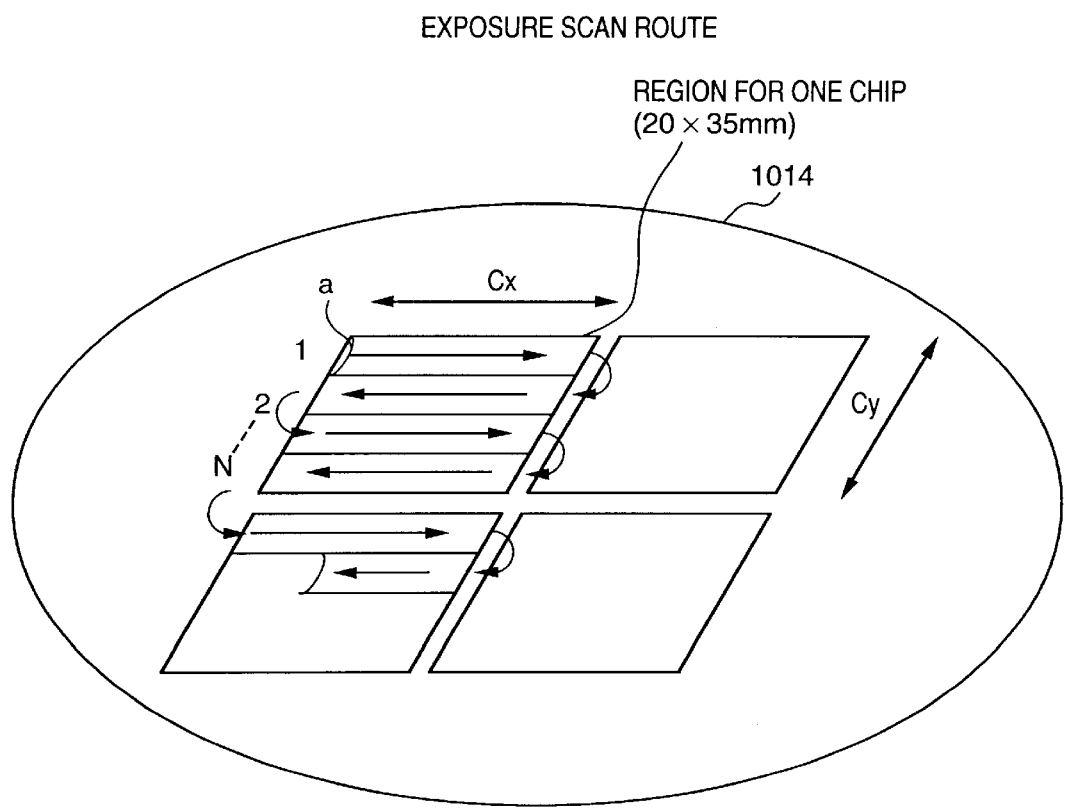
FIG. 26 is an explanatory view of an exposure scan route.

FIG. 26 shows the exposure scan route at that time. For example, the exposure scan route for a 20×35 (mm) chip will be examined below. The length Sy of the arcuated exposure region on the wafer 1014 is set at 5 mm. In this case, the number of scan times is 20/5=4. Assuming that the position indicated by an arc a in FIG. 26 is an exposure start position, the wafer and mask stages 1016 and 1006 are scanned from that position in a direction Cx, and upon completion of the first scan, the two stages 1006 and 1016 are moved in a direction Cy (the direction perpendicular to the scanning direction) by 5 mm on the wafer and by 20 mm on the mask to locate the two stages at the start position of the second scan. The stages 6 and 16 are scanned in the direction opposite to that in the first scan. By repeating this operation, exposure for one chip is completed in a total of two reciprocal scans.

Normally, in the electron beam exposure apparatus, the pattern on the mask 1005 is registered with and transferred by exposure onto a pattern pre-formed on the wafer 1014. In this case, the two patterns must be registered with high precision. However, since the wafer 1014 has already been subjected to the pattern formation process, and the wafer itself has expanded or shrunk, the registration precision lowers even when the pattern on the mask is exposed in the designed reduction ratio. In view of this problem, the control system 1040 acquires the expansion/shrinkage ratio of the wafer 1014 to be exposed, and adjusts the magnification of the reduction electron optical system 1008 via the magnification control circuit 1036 on the basis of the acquired expansion/shrinkage ratio. At the same time, the control system 1040 changes the setup state of the wafer stage driving control circuit 1038 to attain a scanning speed of the wafer stage 1016 corresponding to the set magnification, and also changes the step moving distance of the wafer stage 1016 on the basis of the set magnification.

Embodiment of Device Fabrication

Figure 10:
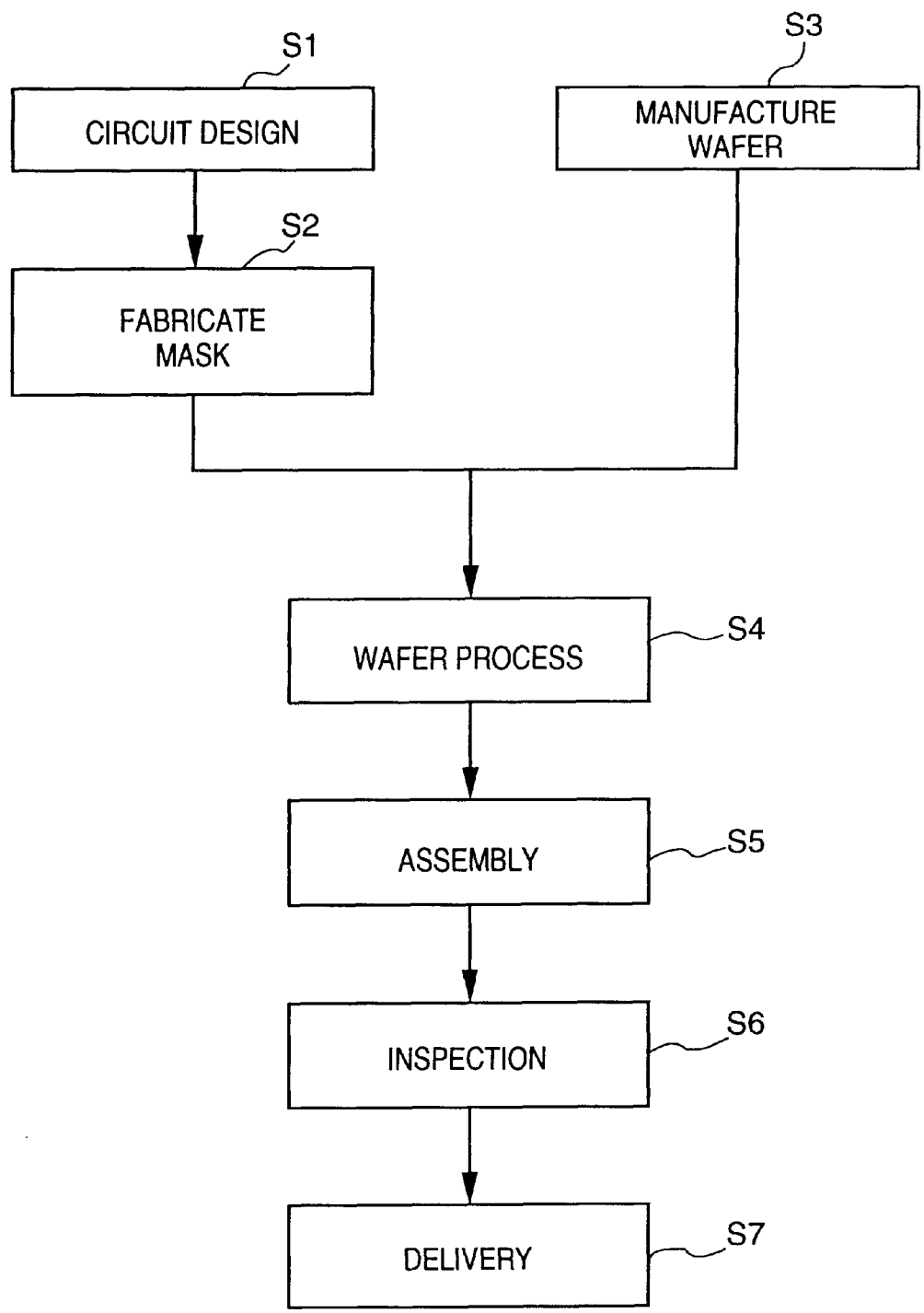
FIG. 10 is a flow chart showing the manufacture of a semiconductor device.

An embodiment of a method of fabricating semiconductor devices using the above-mentioned electron beam exposure apparatus will be described below. FIG. 10 shows the flow in the manufacture of a microdevice (semiconductor chips such as ICs, LSIs, liquid crystal devices, thin film magnetic heads, micromachines, and the like). In step 1 (circuit design), the circuit design of a semiconductor device is made. In step 2 (manufacture mask), a mask formed with a designed circuit pattern is manufactured. In step 3 (fabricate wafer), a wafer is fabricated using materials such as silicon and the like. Step 4 (wafer process) is called a pre-process, and an actual circuit is formed by lithography using the prepared mask and wafer. The next step 5 (assembly) is called a post-process, in which semiconductor chips are assembled using the wafer obtained in step 4, and includes an assembly process (dicing, bonding), a packaging (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

FIG. 11 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19

(remove resist), the resist film which becomes unnecessary after etching is removed. By repetitively executing these steps, multiple circuit patterns are formed on the wafer.

Effects of Embodiments

According to the above-mentioned embodiments, the following effects are expected.

A broader exposure region than in the conventional apparatus can be drawn quickly, and the throughput can be improved greatly.

By providing the function of controlling the size and shape of arcuated electron beams, illuminance nonuniformity of the electron beams can be corrected over a broad exposure region, thus achieving satisfactory exposure.

By providing the focus correction function corresponding to the total current from the mask, an electron beam image can be prevented from being blurred, thus achieving satisfactory exposure.

By providing the function of controlling the transfer reduction ratio to both the electron optical system and the wafer stage driving control unit, the magnification can be easily corrected even in exposure using, e.g., mix & match or the like.

Since a mask that allows overlap exposure and the exposure function are provided upon divisionally exposing the device pattern, the stitching precision of the divided patterns can be improved.

Also, according to the third embodiment, electron beams coming from the electron beam source can be efficiently used as arcuated electron beams.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus for projecting an image formed by electron beams onto an object to be exposed via a reduction electron optical system, comprising:
   carrying means for carrying the object to be exposed; and
   irradiation means for irradiating electron beams having an arcuated sectional shape sandwiched between two arcs having, as a center, an axis of said reduction electron optical system, toward the object to be exposed.

2. The apparatus according to claim 1, further comprising correction means for correcting aberrations produced when the electron beams pass through said reduction electron optical system.

3. The apparatus according to claim 2, wherein said correction means diverges or converges the electron beams to give different divergent or convergent effects in a tangential direction and a radius vector direction of the arc in the arcuated section defined by the electron beams.

4. The apparatus according to claim 3, wherein said correction means has an arcuated aperture for transmitting the electron beams coming from said irradiation means.

5. The apparatus according to claim 1, further comprising support means for supporting a mask formed with a pattern defined by portions that transmit the electron beams and portions that shield the electron beams.

6. The apparatus according to claim 5, wherein said support means supports said mask between said irradiation means and said carrying means.

7. The apparatus according to claim 6, further comprising driving means for moving said support means and said carrying means in a plane perpendicular to the axis of said reduction electron optical system.

8. The apparatus according to claim 7, wherein said driving means synchronously drives said support means and said carrying means.

9. The apparatus according to claim 7, wherein said driving means drives said support means and said carrying means so as to make the electron beams having the arcuated sectional shape scan the object to be exposed in a radius vector direction that equally divides the arc.

10. The apparatus according to claim 9, wherein said driving means drives said support means and said carrying means to expose an entire exposure region on the object to be exposed by repeating a series of operations for changing a region, where the electron beams having the arcuated sectional shape are incident on the object to be exposed, in a direction perpendicular to the radius vector direction that equally divides the arc upon completion of one scan, and then executing the next scan.

11. The apparatus according to claim 10, wherein said driving means drives said support means and said carrying means so as to make end portions of exposure regions exposed by individual scans overlap each other.

12. The apparatus according to claim 11, further comprising driving means for driving a photoelectric conversion surface of photoelectric conversion means.

13. The apparatus according to claim 5, further comprising:
   acquisition means for sequentially acquiring information associated with a total amount of electron beams incident on the object to be exposed; and
   correction means for sequentially correcting a focal point position of said reduction electron optical system on the basis of the acquired information.

14. The apparatus according to claim 13, wherein said acquisition means has memory means for storing information associated with coordinates of the pattern of said mask supported by said support means, and an estimated value of a total amount of electron beams incident at a position of the object to be exposed corresponding to the coordinates, and sequentially acquires the information associated with the total amount of the electron beams incident on the object to be exposed with reference to the stored information.

15. The apparatus according to claim 13, wherein said acquisition means has scattered electron detection means for detecting an amount of electrons scattered by said mask supported by said support means as the information associated with the total amount of the electron beams incident on the object to be exposed.

16. The apparatus according to claim 15, wherein said scattered electron detection means detects the scattered electrons by a shield member for shielding the scattered electrons, which member is arranged at a pupil position of said reduction electron optical system.

17. The apparatus according to claim 1, wherein said irradiation means has:
   an aperture board having an arcuated aperture sandwiched between two arcs having, as the center, the axis of said reduction electron optical system; and
   an electron beam source for emitting collimated electron beams toward said aperture board.

18. The apparatus according to claim 17, wherein said aperture board has slit width adjustment means for adjusting a slit width of said arcuated aperture.

19. The apparatus according to claim 17, wherein said aperture board has slit length adjustment means for adjusting a slit length of said arcuated aperture.

20. The apparatus according to claim 17, wherein said aperture board has:
   slit width adjustment means for adjusting a slit width of said arcuated aperture; and
   slit length adjustment means for adjusting a slit length of said arcuated aperture.

21. The apparatus according to claim 17, wherein said aperture board has slit width adjustment means for individually adjusting slit widths at individual positions of the arcuated aperture.

22. The apparatus according to claim 1, further comprising:
   acquisition means for sequentially acquiring information associated with a total amount of electron beams incident on the object to be exposed; and
   correction means for sequentially correcting a focal point position of said reduction electron optical system on the basis of the acquired information.

23. The apparatus according to claim 1, wherein said irradiation means has:
   photoelectric conversion means for converting light into electrons;
   projection means for projecting an image of light having an arcuated sectional shape sandwiched between two arcs having, as the center, the axis of said reduction electron optical system, onto a photoelectric conversion surface of said photoelectric conversion means; and
   acceleration means for accelerating the electrons output from said photoelectric conversion surface in a direction of the object to be exposed.

24. The apparatus according to claim 23, wherein said projection means has:
   an aperture board having an arcuated aperture sandwiched between two arcs having, as the center, the axis of said reduction electron optical system;
   a light source for emitting collimated light toward said aperture board; and
   a projection optical system for projecting an image of light transmitted through said aperture of said aperture board onto said photoelectric conversion surface.

25. The apparatus according to claim 24, wherein said projection means further comprises support means for supporting a mask at a position between said aperture board and said projection optical system.

26. The apparatus according to claim 25, further comprising driving means for moving said support means and said carrying means in a plane perpendicular to the electron beams.

27. The apparatus according to claim 26, wherein said driving means synchronously drives said support means and said carrying means.

28. The apparatus according to claim 25, further comprising:
   acquisition means for sequentially acquiring information associated with a total amount of electron beams incident on the object to be exposed; and
   correction means for sequentially correcting a focal point position of said reduction electron optical system on the basis of the acquired information.

29. The apparatus according to claim 28, wherein said acquisition means has memory means for storing information associated with coordinates of the pattern of said mask supported by said support means, and an estimated value of a total amount of electron beams incident at a position of the object to be exposed corresponding to the coordinates, and sequentially acquires the information associated with the total amount of the electron beams incident on the object to be exposed with reference to the stored information.

30. The apparatus according to claim 28, wherein said acquisition means has scattered electron detection means for detecting an amount of electrons scattered by said mask supported by said support means as the information associated with the total amount of the electron beams incident on the object to be exposed.

31. The apparatus according to claim 30, wherein said scattered electron detection means detects the scattered electrons by a shield member for shielding the scattered electrons, which member is arranged at a pupil position of said reduction electron optical system.

32. The apparatus according to claim 25 further comprising a driving means which drives said support means and said carrying means so as to make the electron beams having the arcuated sectional shape scan the object to be exposed in a radius vector direction that equally divides the arc.

33. The apparatus according to claim 32, wherein said driving means drives said support means and said carrying means to expose an entire exposure region on the object to be exposed by repeating a series of operations for changing a region, where the electron beams having the arcuated sectional shape are incident on the object to be exposed, in a direction perpendicular to the radius vector direction that equally divides the arc upon completion of one scan, and then executing the next scan.

34. The apparatus according to claim 33, wherein said driving means drives said support means and said carrying means so as to make end portions of exposure regions exposed by individual scans overlap each other.

35. The apparatus according to claim 24, wherein said aperture board has slit width adjustment means for adjusting a slit width of said arcuated aperture.

36. The apparatus according to claim 24, wherein said aperture board has slit length adjustment means for adjusting a slit length of said arcuated aperture.

37. The apparatus according to claim 24, wherein said aperture board has:
   slit width adjustment means for adjusting a slit width of said arcuated aperture; and
   slit length adjustment means for adjusting a slit length of said arcuated aperture.

38. The apparatus according to claim 23, further comprising:
   correction means for correcting aberrations produced when the electron beams pass through said reduction electron optical system.

39. The apparatus according to claim 38, wherein said correction means diverges or converges the electron beams to give different divergent or convergent effects in a tangential direction and a radius vector direction of the arc in the arcuated section defined by the electron beams.

40. The apparatus according to claim 38, wherein said correction means also serves as said acceleration means.

41. The apparatus according to claim 38, wherein said correction means has an arcuated aperture for transmitting the electron beams coming from said irradiation means.

42. The apparatus according to claim 1, wherein said irradiation means has:
   an electron beam source for emitting electron beams;
   first deflection means, having two cylindrical surface electrodes having a first axis as a center, for deflecting the electron beams emitted by said electron beams source by an electric field across the two cylindrical surface electrodes; and an aperture board having an arcuated aperture sandwiched between two arcs having, as the center, the axis of said reduction electron optical system, and said irradiation means irradiates electron beams having an arcuated sectional shape, which have been transmitted through said aperture of said aperture board, of the deflected electron beams toward the object to be exposed.

43. The apparatus according to claim 42, wherein said irradiation means further has second deflection means, having two cylindrical surface electrodes having a second axis as a center, for further deflecting the electron beams which have passed through said first deflection means by an electric field across the two cylindrical surface electrodes in a direction opposite to the electric field across the two cylindrical surface electrodes of said first deflection means, and irradiates electron beams having an arcuated sectional shape, which have been transmitted through said aperture, of the electron beams deflected by said second deflection means toward the object to be exposed.

44. The apparatus according to claim 43, wherein the first and second axes agree with each other.

45. The apparatus according to claim 44, wherein the axis of said electron beam source is offset from the axis of said reduction electron optical system.

46. The apparatus according to claim 43, wherein the first and second axes agree with the axis of said reduction electron optical system.

47. The apparatus according to claim 43, further comprising correction means for correcting aberrations produced when the electron beams pass through said reduction electron optical system.

48. The apparatus according to claim 47, wherein said correction means diverges or converges the electron beams to give different divergent or convergent effects in a tangential direction and a radius vector direction of the arc in the arcuated section defined by the electron beams.

49. The apparatus according to claim 48, wherein said correction means has an arcuated aperture for transmitting the electron beams coming from said irradiation means.

50. The apparatus according to claim 42, further comprising support means for supporting a mask formed with a pattern defined by portions that transmit electrons and portions that shield the electron beams.

51. The apparatus according to claim 50, wherein said support means supports said mask at a position between said irradiation means and said carrying means.

52. The apparatus according to claim 51, further comprising driving means for moving said support means and said carrying means in a plane perpendicular to the axis of said reduction electron optical system.

53. The apparatus according to claim 52, wherein said driving means synchronously drives said support means and said carrying means.

54. A method of manufacturing a device using an electron beam exposure apparatus of claim 1.

55. An electron beam generation apparatus comprising:

an electron beam source for emitting electron beams; and first deflection means, having two cylindrical surface electrodes having a first axis as a center, for deflecting the electron beams emitted by said electron beam source by an electric field across the two cylindrical surface electrodes.

56. The apparatus according to claim 55, further comprising second deflection means, having two cylindrical surface electrodes having a second axis as a center, for further deflecting the electron beams which have passed through said first deflection means by an electric field across the two cylindrical surface electrodes in a direction opposite to the electric field across the two cylindrical surface electrodes of said first deflection means.

57. The apparatus according to claim 56, wherein the first and second axes are the same axis.

58. An aperture board for defining a sectional shape of electron beams in an electron beam exposure apparatus for projecting an image defined by the electron beams onto an object to be exposed via a reduction electron optical system, comprising:

an aperture having an arcuated sectional shape sandwiched between two arcs having a common axis as a center.

59. The aperture board according to claim 58, further comprising slit width adjustment means for adjusting a slit width of said aperture.

60. The aperture board according to claim 58, further comprising slit length adjustment means for adjusting a slit length of said aperture.

61. The aperture board according to claim 58, further comprising:

slit width adjustment means for adjusting a slit width of said aperture; and slit length adjustment means for adjusting a slit length of said aperture.

62. The aperture board according to claim 58, further comprising slit width adjustment means for individually adjusting slit widths at individual positions of said aperture.

63. An electron beam exposure method for projecting an image formed by electron beams onto an object to be exposed via a reduction electron optical system, comprising the step of:

exposing an entire exposure region on the object to be exposed by scanning electron beams having an arcuated sectional shape sandwiched between two arcs having, as a center, an axis of said reduction electron optical system, on the object to be exposed.

64. The method according to claim 63, further comprising the step of correcting aberrations produced when the electron beams pass through said reduction electron optical system.

65. The method according to claim 64, wherein the step of correcting the aberrations includes the step of diverging or converging the electron beams to give different divergent or convergent effects in a tangential direction and a radius vector direction of the arc in the arcuated section defined by the electron beams.

66. An electron beam exposure method for projecting an image formed by electron beams onto an object to be exposed via a reduction electron optical system, comprising the steps of:

projecting an image of light having an arcuated sectional shape sandwiched between two arcs having, as the center, the axis of said reduction electron optical system, onto a photoelectric conversion surface of a photoelectric conversion member;

accelerating and irradiating electron beams having an arcuated sectional shape output from the photoelectric conversion surface in a direction of the object to be exposed; and scanning the electron beams having the arcuated sectional shape on the object to be exposed, thereby exposing an entire exposure region on the object to be exposed.

67. The method according to claim 66, further comprising the step of correcting aberrations produced when the electron beams pass through said reduction electron optical system.

68. The method according to claim 67, wherein the step of correcting the aberrations includes the step of diverging or converging the electron beams to give different divergent or convergent effects in a tangential direction and a radius vector direction of the arc in the arcuated section defined by the electron beams.

69. An electron beam exposure method for projecting an image formed by electron beams onto an object to be exposed via a reduction electron optical system, comprising the steps of:

deflecting electron beams emitted by an electron beam source by an electric field across two cylindrical surface electrodes having a first axis as a center;

irradiating the deflected electron beams onto an aperture board having an arcuated aperture sandwiched between two arcs having, as a center, an axis of said reduction electron optical system;

irradiating electron beams having an arcuated sectional shape, which have been transmitted through the aperture toward the object to be exposed; and scanning the electron beams having the arcuated sectional shape on the object to be exposed, thereby exposing an entire exposure region on the object to be exposed.

70. An electron beam exposure method for projecting an image formed by electron beams onto an object to be exposed via a reduction electron optical system, comprising the steps of:

deflecting electron beams emitted by an electron beam source by an electric field across two cylindrical surface electrodes having a first axis as a center;

further deflecting the deflected electron beams by an electric field, in a direction opposite to a direction of the electric field, across two cylindrical surface electrodes having a second axis as a center;

irradiating the deflected electron beams onto an aperture board having an arcuated aperture sandwiched between two arcs having, as a center, an axis of said reduction electron optical system;

irradiating electron beams having an arcuated sectional shape, which have been transmitted through the aperture toward the object to be exposed; and scanning the electron beams having the arcuted sectional shape on the object to be exposed, thereby exposing an entire exposure region on the object to be exposed.

* * * * *

UNITED STATES PATENT AND TRADEMARK OFFICE
CERTIFICATE OF CORRECTION

PATENT NO. : 6,225,637 B1
DATED : May 1, 2001
INVENTOR(S) : Shigeru Terashima et al.

It is certified that error appears in the above-identified patent and that said Letters Patent is hereby corrected as shown below:

<u>Title page,</u>
Insert -- [*] Notice:    This patent issued in a continued prosecution application filed under 37 CFR 1.53(d), and is subject to the twenty year patent term provisions of 35 U.S.C. 154(a)(2). --.

<u>Column 2,</u>
Line 9, "am" should read -- beam --.

<u>Column 4,</u>
Line 25, "the-arrangement" should read -- the arrangement --.

<u>Column 8,</u>
Line 26, "setting-the" should read -- setting the --.

<u>Column 13,</u>
Line 28, "(NA×nΘ)" should read -- (NA=nΘ) --.
Line 36, "lens." should read -- lens --.

<u>Column 28,</u>
Line 62, "thereby" should read -- ¶thereby --.

<u>Column 30,</u>
Line 19, "arcuted" should read -- arcuated --.

Signed and Sealed this

Twenty-sixth Day of March, 2002

*Attest:*

*Attesting Officer*

JAMES E. ROGAN
*Director of the United States Patent and Trademark Office*